US011353555B2

(12) United States Patent
Gaalema

(10) Patent No.: US 11,353,555 B2
(45) Date of Patent: Jun. 7, 2022

(54) DETECTOR QUENCH CIRCUIT FOR LIDAR SYSTEM COMPRISING A DISCRETE TRANSISTOR TO DRAW A QUENCH CURRENT TO ENABLE A DROP IN A REVERSE BIAS VOLTAGE APPLIED TO AN AVALANCHE PHOTODIODE

(71) Applicant: Luminar Technologies, Inc., Orlando, FL (US)

(72) Inventor: Stephen D. Gaalema, Colorado Springs, CO (US)

(73) Assignee: Luminar, LLC, Orlando, FL (US)

( * ) Notice: Subject to any disclaimer, the term of this patent is extended or adjusted under 35 U.S.C. 154(b) by 1110 days.

(21) Appl. No.: 16/178,080

(22) Filed: Nov. 1, 2018

(65) Prior Publication Data
US 2020/0025928 A1 Jan. 23, 2020

Related U.S. Application Data

(60) Provisional application No. 62/580,998, filed on Nov. 2, 2017, provisional application No. 62/580,440, filed on Nov. 1, 2017.

(51) Int. Cl.
| | |
|---|---|
| *G01S 17/88* | (2006.01) |
| *G01S 7/48* | (2006.01) |
| *G01S 7/4912* | (2020.01) |
| *G01S 17/42* | (2006.01) |
| *G01S 17/931* | (2020.01) |
| *G01J 1/46* | (2006.01) |
| *G01S 7/4861* | (2020.01) |

(Continued)

(52) U.S. Cl.
CPC ............ *G01S 7/4804* (2013.01); *G01J 1/46* (2013.01); *G01S 7/4861* (2013.01); *G01S 7/4918* (2013.01); *G01S 17/42* (2013.01); *G01S 17/88* (2013.01); *G01S 17/931* (2020.01); *H03K 17/0416* (2013.01); *H03K 17/74* (2013.01)

(58) Field of Classification Search
CPC . G01S 7/48; G01S 7/486; G01S 17/88; G01S 17/86; G01S 17/66; G01S 17/50; G01S 17/89; G01S 17/93; G01S 19/00; G01S 7/491; G01J 1/44; H03K 17/002; H03K 17/08; H03K 17/74; H03K 17/76; H03K 17/04; H01L 31/07; H01L 31/09; H01L 31/02
USPC ................................. 250/214 R, 214.1, 221
See application file for complete search history.

(56) References Cited

U.S. PATENT DOCUMENTS

| | | |
|---|---|---|
| 5,699,151 A | 12/1997 | Akasu |
| 5,949,530 A | 9/1999 | Wetteborn |
| 9,575,184 B2 | 2/2017 | Gilliland et al. |

(Continued)

OTHER PUBLICATIONS

Restriction Requirement dated May 13, 2021 for U.S. Appl. No. 16/178,049.

(Continued)

*Primary Examiner* — Que Tan Le

(57) ABSTRACT

A circuit for quenching an avalanche photodiode (APD) detector is disclosed herein. The circuit may comprise a discrete transistor configured to draw a quench current so as to enable a drop in a reverse bias voltage applied to the APD detector, and an integrated circuit connected to the discrete transistor, the integrated circuit including a plurality of circuit elements for controlling the reverse bias voltage.

16 Claims, 15 Drawing Sheets

(51) Int. Cl.
  *H03K 17/0416*  (2006.01)
  *H03K 17/74*    (2006.01)

(56) References Cited

U.S. PATENT DOCUMENTS

| | | |
|---|---|---|
| 10,852,399 B2 * | 12/2020 | Fenigstein ............ G01S 7/4863 |
| 2004/0066501 A1 | 4/2004 | Nourrcier et al. |
| 2004/0070748 A1 | 4/2004 | Inaba et al. |
| 2007/0024841 A1 | 2/2007 | Kloza |
| 2008/0002192 A1 | 1/2008 | Ofer |
| 2017/0153319 A1 | 6/2017 | Villeneuve et al. |
| 2018/0284279 A1 | 10/2018 | Campbell et al. |
| 2019/0004158 A1 | 1/2019 | Simard-Bilodeau et al. |
| 2019/0049583 A1 | 2/2019 | Xu |
| 2019/0078934 A1 | 3/2019 | Weber |

OTHER PUBLICATIONS

Non-Final Office Action dated Sep. 14, 2021 for U.S. Appl. No. 16/178,049.
Non-Final Office Action dated Apr. 14, 2021 for U.S. Appl. No. 16/178,049.

* cited by examiner

DETECTOR QUENCH CIRCUIT FOR LIDAR SYSTEM COMPRISING A DISCRETE TRANSISTOR TO DRAW A QUENCH CURRENT TO ENABLE A DROP IN A REVERSE BIAS VOLTAGE APPLIED TO AN AVALANCHE PHOTODIODE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. Namely, this application claims priority to U.S. Provisional Patent Application 62/580,440, filed Nov. 1, 2017, the entirety of which is hereby incorporated by reference herein. This application claims further priority to U.S. Provisional Patent Application 62/580,998, filed Nov. 2, 2017, the entirety of which is hereby incorporated by reference herein.

BACKGROUND

Technical Field

This disclosure generally relates to lidar systems.

Description of the Related Art

Light detection and ranging (lidar) is a technology that can be used to measure distances to remote targets. Typically, a lidar system includes a light source and an optical receiver. The light source can be, for example, a laser which emits light having a particular operating wavelength. The operating wavelength of a lidar system may lie, for example, in the infrared, visible, or ultraviolet portions of the electromagnetic spectrum. The light source emits light toward a target which then scatters the light. Some of the scattered light is received back at the receiver. The system determines the distance to the target based on one or more characteristics associated with the returned light. For example, the system may determine the distance to the target based on the time of flight of a returned light pulse.

SUMMARY

One embodiment of the invention provides a circuit for quenching an avalanche photodiode (APD) detector, the circuit comprising: a discrete transistor configured to draw a quench current so as to enable a drop in a reverse bias voltage applied to the APD detector; and an integrated circuit connected to the discrete transistor, the integrated circuit including a plurality of circuit elements for controlling the reverse bias voltage. In some embodiments, the integrated circuit further comprises a plurality of comparators, wherein the output of each comparator is connected to an input channel of a time-to-digital converter. In other embodiments, the discrete transistor is connected to the integrated circuit via wire bonding. In another example, the discrete transistor is connected to the integrated circuit via bump bonding. In other embodiments, the discrete transistor is connected to a reverse bias voltage source via a resistor. In other embodiments, the drop in the reverse bias voltage is across the resistor. In other embodiments, a capacitor is connected to the resistor to reduce noise created by the resistor. In another example, the integrated circuit includes a resistor network and a second comparator, the resistor network being configured to sense the reverse bias voltage applied to the APD detector and to provide a reduced version of the reverse bias voltage to the second comparator. In other embodiments, the second comparator causes the discrete transistor to cease drawing the quench current when the reverse bias voltage drops below a threshold value.

In other embodiments, the integrated circuit includes a first comparator configured to determine when a detected optical pulse has exceeded a jamming threshold. In other embodiments, the jamming threshold is set to avoid damage to the APD detector. In another example, the circuit is configured to quench the APD detector when the jamming threshold is exceeded. In other embodiments, the circuit is configured to quench the APD detector within 1 ns. In other embodiments, the output of the first comparator is latched in an active state when the detected optical pulse has exceeded the jamming threshold. In other embodiments, the first comparator causes the discrete transistor to draw the quench current when the detected optical pulse has exceeded the jamming threshold.

DETAILED DESCRIPTION

Figure 1:
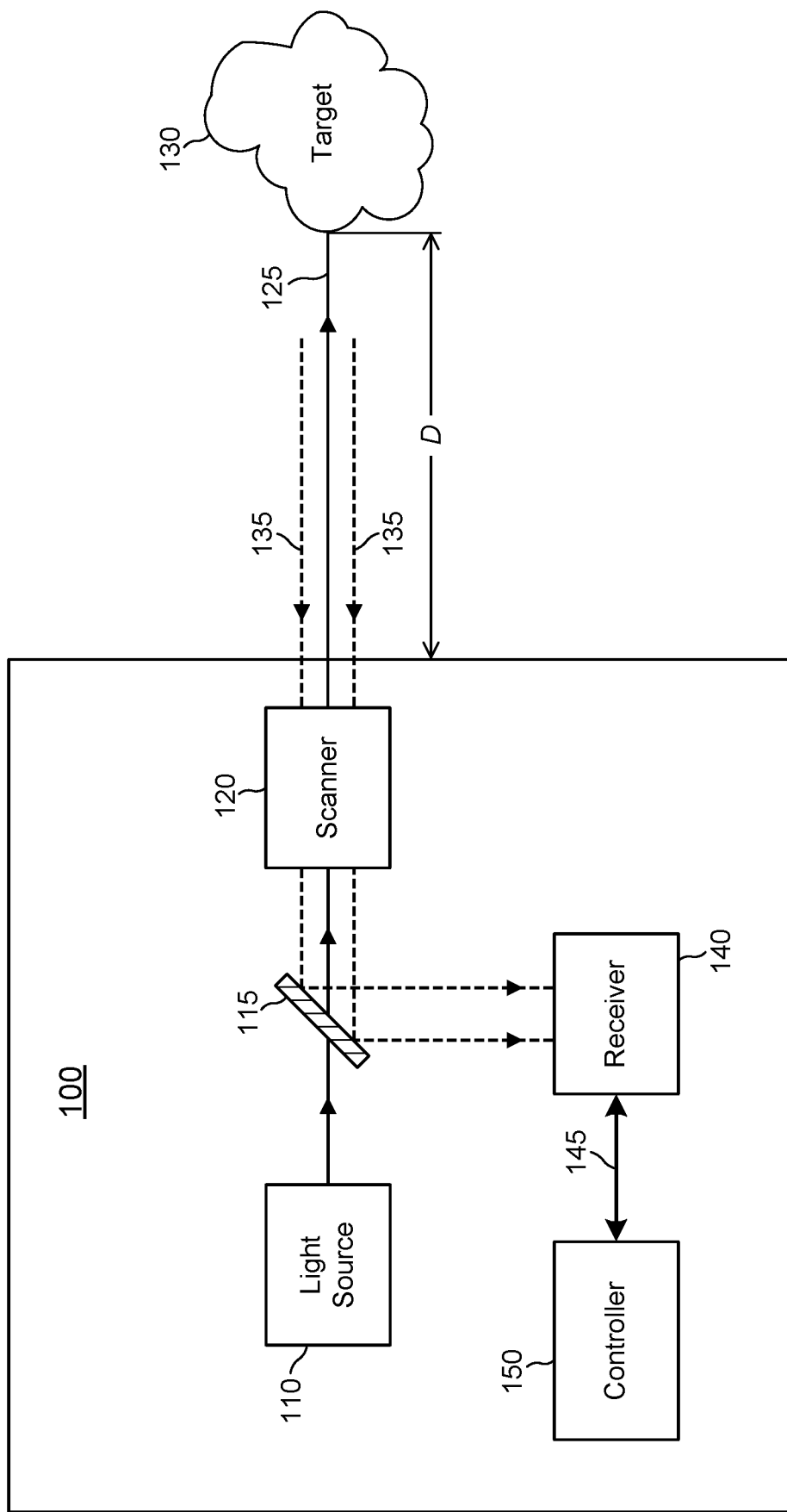
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, or a laser detection and ranging (LADAR or ladar) system. In particular embodiments, a lidar system 100 may include a light source 110, mirror 115, scanner 120, receiver 140, or controller 150. The light source 110 may be, for example, a laser which emits light having a particular operating wavelength in the infrared, visible, or ultraviolet portions of the electromagnetic spectrum. As an example, light source 110 may include a laser with an operating wavelength between approximately 1.2 µm and 1.7 µm. The light source 110 emits an output beam of light 125 which may be continuous-wave, pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is directed by mirror 115 to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ. In particular embodiments, output beam 125 may be referred to as a laser beam, light beam, optical beam, emitted beam, or beam. In particular embodiments, input beam 135 may be referred to as a return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and generate one or more representative signals. For example, the receiver 140 may generate an output electrical signal 145 that is representative of the input beam 135. This electrical signal 145 may be sent to controller 150. In particular embodiments, controller 150 may include a processor, computing system (e.g., an ASIC or FPGA), or other suitable circuitry configured to analyze one or more characteristics of the electrical signal 145 from the receiver 140 to determine one or more characteristics of the target 130, such as its distance downrange from the lidar system 100. This can be done, for example, by analyzing the time of flight or phase modulation for a beam of light 125 transmitted by the light source 110. If lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as $D=c \cdot T/2$, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 µs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed laser. As an example, light source 110 may be a pulsed laser configured to produce or emit pulses of light with a pulse duration or pulse width of approximately 10 picoseconds (ps) to 20 nanoseconds (ns). As another example, light source 110 may be a pulsed laser that produces pulses with a pulse duration of approximately 1-5 ns. As another example, light source 110 may be a pulsed laser that produces pulses at a pulse repetition frequency of approximately 100 kHz to 5 MHz or a pulse period (e.g., a time between consecutive pulses) of approximately 200 ns to 10 µs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 µs. As another example, light source 110 may have a pulse repetition frequency that can be varied from approximately 500 kHz to 3 MHz. As used herein, a pulse of light may be referred to as an optical pulse, a light pulse, or a pulse.

In particular embodiments, light source 110 may produce a free-space output beam 125 having any suitable average optical power, and the output beam 125 may have optical pulses with any suitable pulse energy or peak optical power. As an example, output beam 125 may have an average power of approximately 1 milliwatt (mW), 10 mW, 100 mW, 1 watt (W), 10 W, or any other suitable average power. As another example, output beam 125 may include pulses with a pulse energy of approximately 0.01 µJ, 0.1 µJ, 1 µJ, 10 µJ, 100 µJ, 1 mJ, or any other suitable pulse energy. As another example, output beam 125 may include pulses with a peak power of approximately 10 W, 100 W, 1 kW, 5 kW, 10 kW, or any other suitable peak power. An optical pulse with a duration of 1 ns and a pulse energy of 1 µJ has a peak power of approximately 1 kW. If the pulse repetition frequency is 500 kHz, then the average power of an output beam 125 with 1-µJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, or a vertical-cavity surface-emitting laser (VCSEL). As an example, light source 110 may include an aluminum-gallium-arsenide (AlGaAs) laser diode, an indium-gallium-arsenide (InGaAs) laser diode, or an indium-gallium-arsenide-phosphide (InGaAsP)

laser diode. In particular embodiments, light source 110 may include a pulsed laser diode with a peak emission wavelength of approximately 1400-1600 nm. As an example, light source 110 may include a laser diode that is current modulated to produce optical pulses. In particular embodiments, light source 110 may include a pulsed laser diode followed by one or more optical-amplification stages. As an example, light source 110 may be a fiber-laser module that includes a current-modulated laser diode with a peak wavelength of approximately 1550 nm followed by a single-stage or a multi-stage erbium-doped fiber amplifier (EDFA). As another example, light source 110 may include a continuous-wave (CW) or quasi-CW laser diode followed by an external optical modulator (e.g., an electro-optic modulator), and the output of the modulator may be fed into an optical amplifier.

In particular embodiments, an output beam of light 125 emitted by light source 110 may be a collimated optical beam with any suitable beam divergence, such as for example, a divergence of approximately 0.5 to 5.0 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a divergence of 2 mrad may have a beam diameter or spot size of approximately 20 cm at a distance of 100 m from lidar system 100. In particular embodiments, output beam 125 may be an astigmatic beam or may have a substantially elliptical cross section and may be characterized by two divergence values. As an example, output beam 125 may have a fast axis and a slow axis, where the fast-axis divergence is greater than the slow-axis divergence. As another example, output beam 125 may be an astigmatic beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce linearly polarized light, and lidar system 100 may include a quarter-wave plate that converts this linearly polarized light into circularly polarized light. The circularly polarized light may be transmitted as output beam 125, and lidar system 100 may receive input beam 135, which may be substantially or at least partially circularly polarized in the same manner as the output beam 125 (e.g., if output beam 125 is right-hand circularly polarized, then input beam 135 may also be right-hand circularly polarized). The input beam 135 may pass through the same quarter-wave plate (or a different quarter-wave plate) resulting in the input beam 135 being converted to linearly polarized light which is orthogonally polarized (e.g., polarized at a right angle) with respect to the linearly polarized light produced by light source 110. As another example, lidar system 100 may employ polarization-diversity detection where two polarization components are detected separately. The output beam 125 may be linearly polarized, and the lidar system 100 may split the input beam 135 into two polarization components (e.g., s-polarization and p-polarization) which are detected separately by two photodiodes (e.g., a balanced photoreceiver that includes two photodiodes).

In particular embodiments, lidar system 100 may include one or more optical components configured to condition, shape, filter, modify, steer, or direct the output beam 125 or the input beam 135. As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, or holographic elements. In particular embodiments, lidar system 100 may include a telescope, one or more lenses, or one or more mirrors to expand, focus, or collimate the output beam 125 to a desired beam diameter or divergence. As an example, the lidar system 100 may include one or more lenses to focus the input beam 135 onto an active region of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto an active region of receiver 140. As illustrated in FIG. 1, the lidar system 100 may include mirror 115 (which may be a metallic or dielectric mirror), and mirror 115 may be configured so that light beam 125 passes through the mirror 115. As an example, mirror 115 (which may be referred to as an overlap mirror, superposition mirror, or beam-combiner mirror) may include a hole, slot, or aperture which output light beam 125 passes through. As another example, mirror 115 may be configured so that at least 80% of output beam 125 passes through mirror 115 and at least 80% of input beam 135 is reflected by mirror 115. In particular embodiments, mirror 115 may provide for output beam 125 and input beam 135 to be substantially coaxial so that the two beams travel along substantially the same optical path (albeit in opposite directions).

In particular embodiments, lidar system 100 may include a scanner 120 to steer the output beam 125 in one or more directions downrange. As an example, scanner 120 may include one or more scanning mirrors that are configured to rotate, oscillate, tilt, pivot, or move in an angular manner about one or more axes. In particular embodiments, a flat scanning mirror may be attached to a scanner actuator or mechanism which scans the mirror over a particular angular range. As an example, scanner 120 may include a galvanometer scanner, a resonant scanner, a piezoelectric actuator, a polygonal scanner, a rotating-prism scanner, a voice coil motor, an electric motor (e.g., a DC motor, a brushless DC motor, a synchronous electric motor, or a stepper motor), or a microelectromechanical systems (MEMS) device, or any other suitable actuator or mechanism. In particular embodiments, scanner 120 may be configured to scan the output beam 125 over a 5-degree angular range, 20-degree angular range, 30-degree angular range, 60-degree angular range, or any other suitable angular range. As an example, a scanning mirror may be configured to periodically oscillate or rotate back and forth over a 15-degree range, which results in the output beam 125 scanning across a 30-degree range (e.g., a θ-degree rotation by a scanning mirror results in a 2θ-degree angular scan of output beam 125). In particular embodiments, a field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, or any other suitable FOR. In particular embodiments, a FOR may be referred to as a scan region.

In particular embodiments, scanner 120 may be configured to scan the output beam 125 (which includes at least a portion of the pulses of light emitted by light source 110) across a FOR of the lidar system 100. In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first mirror and a second mirror, where the first mirror directs the output beam 125 toward the second mirror, and the second mirror directs the output beam 125 downrange. As an example, the first mirror may scan the output beam 125 along a first direction, and the second mirror may scan the output beam 125 along a second direction that is substantially orthogonal to the first direction. As another example, the first mirror may scan the output beam 125 along a substantially horizontal direction, and the second mirror may scan the output beam 125 along a substantially vertical direction (or vice versa). In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern (which may be referred to as an optical scan pattern, optical scan path, or scan path) may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternately, the pixels may have a particular nonuniform distribution (e.g., the pixels may be distributed across all or a portion of the 60°×20° FOR, and the pixels may have a higher density in one or more particular regions of the 60°×20° FOR).

In particular embodiments, a light source 110 may emit pulses of light which are scanned by scanner 120 across a FOR of lidar system 100. One or more of the emitted pulses of light may be scattered by a target 130 located downrange from the lidar system 100, and a receiver 140 may detect at least a portion of the pulses of light scattered by the target 130. In particular embodiments, receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions). Receiver 140 may have an active region or an avalanche-multiplication region that includes silicon, germanium, or InGaAs. The active region of receiver 140 may have any suitable size, such as for example, a diameter or width of approximately 20-500 μm.

In particular embodiments, receiver 140 may include circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more characteristics (e.g., rising edge, falling edge, amplitude, or duration) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, a lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

In particular embodiments, one or more lidar systems 100 may be integrated into a vehicle. As an example, multiple lidar systems 100 may be integrated into a car to provide a complete 360-degree horizontal FOR around the car. As another example, 6-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in the driving process. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

Figure 2:
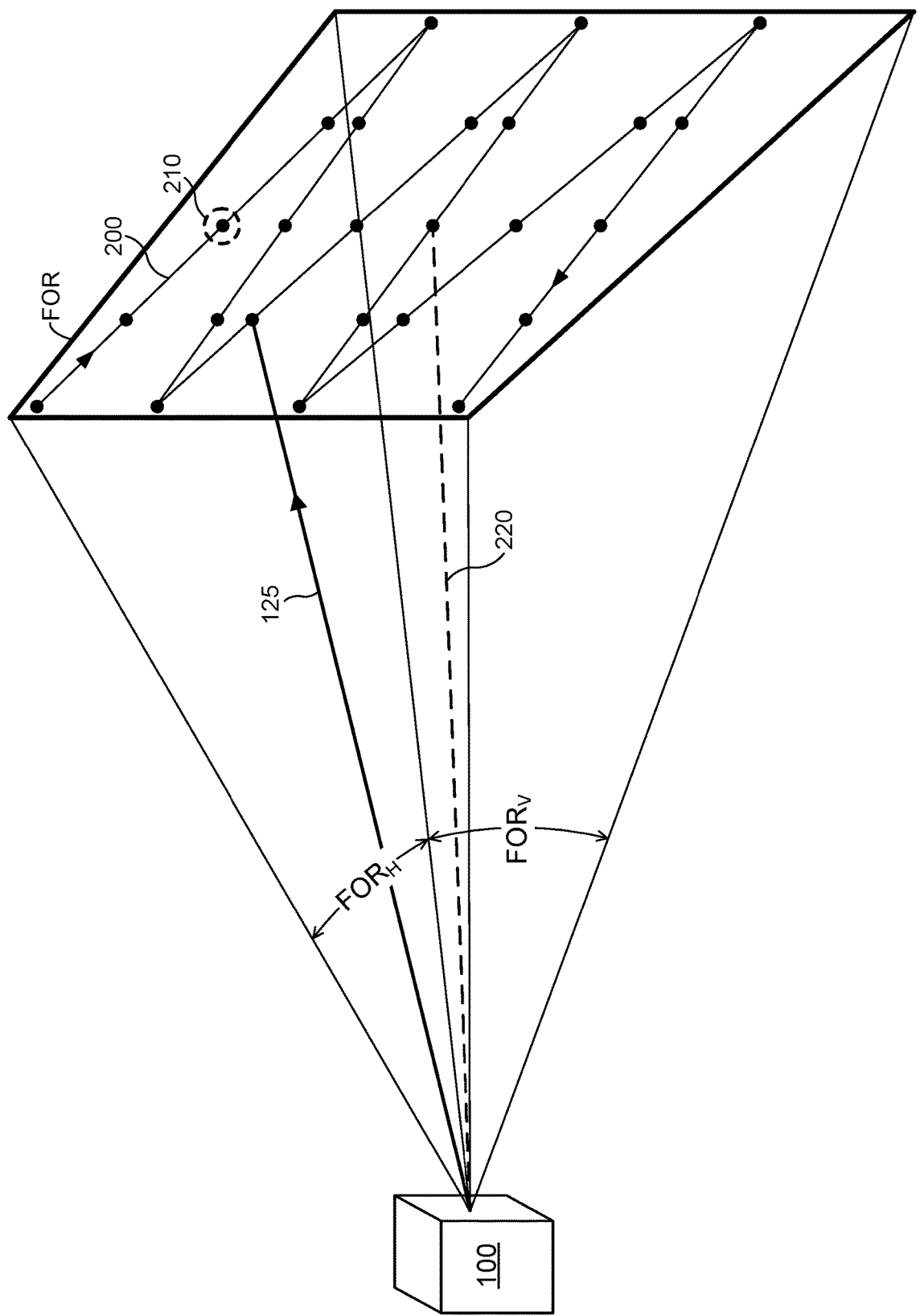
FIG. 2 illustrates an example scan pattern produced by a lidar system.

FIG. 2 illustrates an example scan pattern 200 produced by a lidar system 100. A scan pattern 200 (which may be referred to as a scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°. In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses and one or more corresponding distance measurements. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
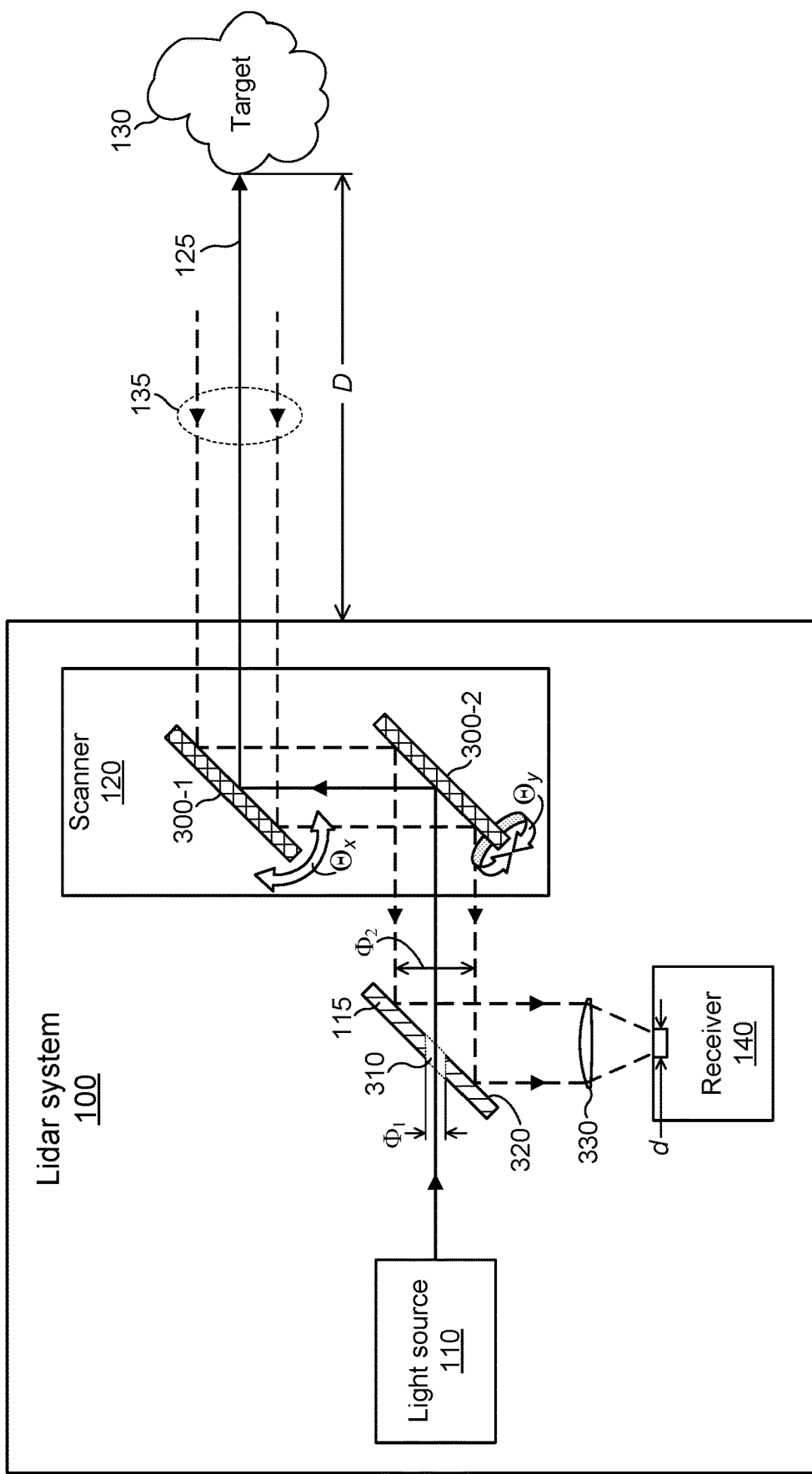
FIG. 3 illustrates an example lidar system with an example overlap mirror.

FIG. 3 illustrates an example lidar system 100 with an example overlap mirror 115. In particular embodiments, a lidar system 100 may include a light source 110 configured to emit pulses of light and a scanner 120 configured to scan at least a portion of the emitted pulses of light across a field of regard. As an example, the light source 110 may include a pulsed solid-state laser or a pulsed fiber laser, and the optical pulses produced by the light source 110 may be directed through aperture 310 of overlap mirror 115 and then coupled to scanner 120. In particular embodiments, a lidar system 100 may include a receiver 140 configured to detect at least a portion of the scanned pulses of light scattered by a target 130 located a distance D from the lidar system 100. As an example, one or more pulses of light that are directed downrange from lidar system 100 by scanner 120 (e.g., as part of output beam 125) may scatter off a target 130, and a portion of the scattered light may propagate back to the lidar system 100 (e.g., as part of input beam 135) and be detected by receiver 140.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to a maximum range $R_{MAX}$ of the lidar system 100. In particular embodiments, a maximum range (which may be referred to as a maximum distance) of a lidar system 100 may refer to the maximum distance over which the lidar system 100 is configured to sense or identify targets 130 that appear in a field of regard of the lidar system 100. The maximum range of lidar system 100 may be any suitable distance, such as for example, 25 m, 50 m, 100 m, 200 m, 500 m, or 1 km. As an example, a lidar system 100 with a 200-m maximum range may be configured to sense or identify various targets 130 located up to 200 m away from the lidar system 100. For a lidar system 100 with a 200-m maximum range ($R_{MAX}$=200 m), the time of flight corresponding to the maximum range is approximately 2. $R_{MAX}/c \cong 1.33$ µs.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, overlap mirror 115, scanner 120, and receiver 140 of a lidar system 100. Additionally, the lidar-system enclosure may include a controller 150, or a controller 150 may be located remotely from the enclosure. The lidar-system enclosure may also include one or more electrical connections for conveying electrical power or electrical signals to or from the enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 1400 nm and approximately 2100 nm. As an example, lidar system 100 may include a laser with an operating wavelength between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 1530 nm and approximately 1560 nm. As another example, lidar system 100 may be a Class 1 or Class I laser product that includes a fiber laser or solid-state laser with an operating wavelength between approximately 1400 nm and approximately 1600 nm.

In particular embodiments, scanner 120 may include one or more mirrors, where each mirror is mechanically driven by a galvanometer scanner, a resonant scanner, a MEMS device, a voice coil motor, an electric motor, or any suitable combination thereof. A galvanometer scanner (which may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror. A resonant scanner (which may be referred to as a resonant actuator) may include a spring-like mechanism driven by an actuator to produce a periodic oscillation at a substantially fixed frequency (e.g., 1 kHz). A MEMS-based scanning device may include a mirror with a diameter between approximately 1 and 10 mm, where the mirror is rotated back and forth using electromagnetic or electrostatic actuation. A voice coil motor (which may be referred to as a voice coil actuator) may include a magnet and coil. When an electrical current is supplied to the coil, a translational force is applied to the magnet, which causes a mirror attached to the magnet to move or rotate. An electric motor, such as for example, a brushless DC motor or a synchronous electric motor, may be used to continuously rotate a mirror at a substantially fixed frequency (e.g., a rotational frequency of approximately 1 Hz, 10 Hz, 50 Hz, 100 Hz, 500 Hz, or 1,000 Hz). The mirror may be continuously rotated in one rotation direction (e.g., clockwise or counter-clockwise relative to a particular rotation axis).

In particular embodiments, a scanner 120 may include any suitable number of mirrors driven by any suitable number of mechanical actuators. As an example, a scanner 120 may include a single mirror configured to scan an output beam 125 along a single direction (e.g., a scanner 120 may be a one-dimensional scanner that scans along a horizontal or vertical direction). The mirror may be driven by one actuator (e.g., a galvanometer) or two actuators configured to drive the mirror in a push-pull configuration. As another example, a scanner 120 may include a single mirror that scans an output beam 125 along two directions (e.g., horizontal and vertical). The mirror may be driven by two actuators, where each actuator provides rotational motion along a particular direction or about a particular axis. As another example, a scanner 120 may include two mirrors, where one mirror scans an output beam 125 along a substantially horizontal direction and the other mirror scans the output beam 125 along a substantially vertical direction. In the example of FIG. 3, scanner 120 includes two mirrors, mirror 300-1 and mirror 300-2. Mirror 300-2 rotates along the $\Theta_y$ direction and scans output beam 125 along a substantially vertical direction, and mirror 300-1 rotates along the $\Theta_x$ direction and scans output beam 125 along a substantially horizontal direction.

In particular embodiments, a scanner 120 may include two mirrors, where each mirror is driven by a corresponding galvanometer scanner. As an example, scanner 120 may include a galvanometer actuator that scans mirror 300-1 along a first direction (e.g., horizontal), and scanner 120 may include another galvanometer actuator that scans mirror 300-2 along a second direction (e.g., vertical). In particular embodiments, a scanner 120 may include two mirrors, where one mirror is driven by a galvanometer actuator and the other mirror is driven by a resonant actuator. As an example, a galvanometer actuator may scan mirror 300-1 along a first direction, and a resonant actuator may scan mirror 300-2 along a second direction. The first and second scanning directions may be substantially orthogonal to one another. As an example, the first direction may be substantially vertical, and the second direction may be substantially horizontal, or vice versa. In particular embodiments, a scanner 120 may include two mirrors, where one mirror is driven by an electric motor and the other mirror is driven by a galvanometer actuator. As an example, mirror 300-1 may be a polygon mirror that is rotated about a fixed axis by an electric motor (e.g., a brushless DC motor), and mirror 300-2 may be driven by a galvanometer or MEMS actuator. In particular embodiments, a scanner 120 may include two mirrors, where both mirrors are driven by electric motors. As an example, mirror 300-2 may be a polygon mirror driven by an electric motor, and mirror 300-1 may be driven by another electric motor. In particular embodiments, a scanner 120 may include one mirror driven by two actuators which are configured to scan the mirror along two substantially orthogonal directions. As an example, one mirror may be driven along a substantially horizontal direction by a resonant actuator or a galvanometer actuator, and the mirror may also be driven along a substantially vertical direction by a galvanometer actuator. As another example, a mirror may be driven along two substantially orthogonal directions by two resonant actuators or by two electric motors.

In particular embodiments, a scanner 120 may include a mirror configured to be scanned along one direction by two actuators arranged in a push-pull configuration. Driving a mirror in a push-pull configuration may refer to a mirror that is driven in one direction by two actuators. The two actuators may be located at opposite ends or sides of the mirror, and the actuators may be driven in a cooperative manner so that when one actuator pushes on the mirror, the other actuator pulls on the mirror, and vice versa. As an example, a mirror may be driven along a horizontal or vertical direction by two voice coil actuators arranged in a push-pull configuration. In particular embodiments, a scanner 120 may include one mirror configured to be scanned along two axes, where motion along each axis is provided by two actuators arranged in a push-pull configuration. As an example, a mirror may be driven along a horizontal direction by two resonant actuators arranged in a horizontal push-pull configuration, and the mirror may be driven along a vertical direction by another two resonant actuators arranged in a vertical push-pull configuration.

In particular embodiments, a scanner 120 may include two mirrors which are driven synchronously so that the output beam 125 is directed along any suitable scan pattern 200. As an example, a galvanometer actuator may drive mirror 300-1 with a substantially linear back-and-forth motion (e.g., the galvanometer may be driven with a substantially sinusoidal or triangle-shaped waveform) that causes output beam 125 to trace a substantially horizontal back-and-forth pattern. Additionally, another galvanometer actuator may scan mirror 300-2 along a substantially vertical direction. For example, the two galvanometers may be synchronized so that for every 64 horizontal traces, the output beam 125 makes a single trace along a vertical direction. As another example, a resonant actuator may drive mirror 300-1 along a substantially horizontal direction, and a galvanometer actuator or a resonant actuator may scan mirror 300-2 along a substantially vertical direction.

In particular embodiments, a scanner 120 may include one mirror driven by two or more actuators, where the actuators are driven synchronously so that the output beam 125 is directed along a particular scan pattern 200. As an example, one mirror may be driven synchronously along two substantially orthogonal directions so that the output beam 125 follows a scan pattern 200 that includes substantially straight lines. In particular embodiments, a scanner 120 may include two mirrors driven synchronously so that the synchronously driven mirrors trace out a scan pattern 200 that includes substantially straight lines. As an example, the scan pattern 200 may include a series of substantially straight lines directed substantially horizontally, vertically, or along any other suitable direction. The straight lines may be achieved by applying a dynamically adjusted deflection along a vertical direction (e.g., with a galvanometer actuator) as an output beam 125 is scanned along a substantially horizontal direction (e.g., with a galvanometer or resonant actuator). If a vertical deflection is not applied, the output beam 125 may trace out a curved path as it scans from side to side. By applying a vertical deflection as the mirror is scanned horizontally, a scan pattern 200 that includes substantially straight lines may be achieved. In particular embodiments, a vertical actuator may be used to apply both a dynamically adjusted vertical deflection as the output beam 125 is scanned horizontally as well as a discrete vertical offset between each horizontal scan (e.g., to step the output beam 125 to a subsequent row of a scan pattern 200).

In the example of FIG. 3, lidar system 100 produces an output beam 125 and receives light from an input beam 135. The output beam 125, which includes at least a portion of the pulses of light emitted by light source 110, may be scanned across a field of regard. The input beam 135 may include at least a portion of the scanned pulses of light which are scattered by one or more targets 130 and detected by receiver 140. In particular embodiments, output beam 125 and input beam 135 may be substantially coaxial. The input and output beams being substantially coaxial may refer to the beams being at least partially overlapped or sharing a common propagation axis so that input beam 135 and output beam 125 travel along substantially the same optical path (albeit in opposite directions). As output beam 125 is scanned across a field of regard, the input beam 135 may follow along with the output beam 125 so that the coaxial relationship between the two beams is maintained.

In particular embodiments, a lidar system 100 may include an overlap mirror 115 configured to overlap the input beam 135 and output beam 125 so that they are substantially coaxial. In FIG. 3, the overlap mirror 115 includes a hole, slot, or aperture 310 which the output beam 125 passes through and a reflecting surface 320 that reflects at least a portion of the input beam 135 toward the receiver 140. The overlap mirror 115 may be oriented so that input beam 135 and output beam 125 are at least partially overlapped. In particular embodiments, input beam 135 may pass through a lens 330 which focuses the beam onto an active region of the receiver 140. The active region may refer to an area over which receiver 140 may receive or detect input light. The active region may have any suitable size or diameter d, such as for example, a diameter of approximately 25 μm, 50 μm, 80 μm, 100 μm, 200 μm, 500 μm, 1 mm, 2 mm, or 5 mm. In particular embodiments, overlap mirror 115 may have a reflecting surface 320 that is substantially flat or the reflecting surface 320 may be curved (e.g., mirror 115 may be an off-axis parabolic mirror configured to focus the input beam 135 onto an active region of the receiver 140). A reflecting surface 320 (which may be referred to as a reflective surface 320) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, aperture 310 may have any suitable size or diameter $\Phi_1$, and input beam 135 may have any suitable size or diameter $\Phi_2$, where $\Phi_2$ is greater than $\Phi_1$. As an example, aperture 310 may have a diameter $\Phi_1$ of approximately 0.2 mm, 0.5 mm, 1 mm, 2 mm, 3 mm, 5 mm, or 10 mm, and input beam 135 may have a diameter $\Phi_2$ of approximately 2 mm, 5 mm, 10 mm, 15 mm, 20 mm, 30 mm, 40 mm, or 50 mm. In particular embodiments, reflective surface 320 of overlap mirror 115 may reflect greater than or equal to 70% of input beam 135 toward the receiver 140. As an example, if reflective surface 320 has a reflectivity R at an operating wavelength of the light source 110, then the fraction of input beam 135 directed toward the receiver 140 may be expressed as $R \times [1-(\Phi_1/\Phi_2)^2]$. For example, if R is 95%, $\Phi_1$ is 2 mm, and $\Phi_2$ is 10 mm, then approximately 91% of input beam 135 may be directed toward the receiver 140 by reflective surface 320.

Figure 4:
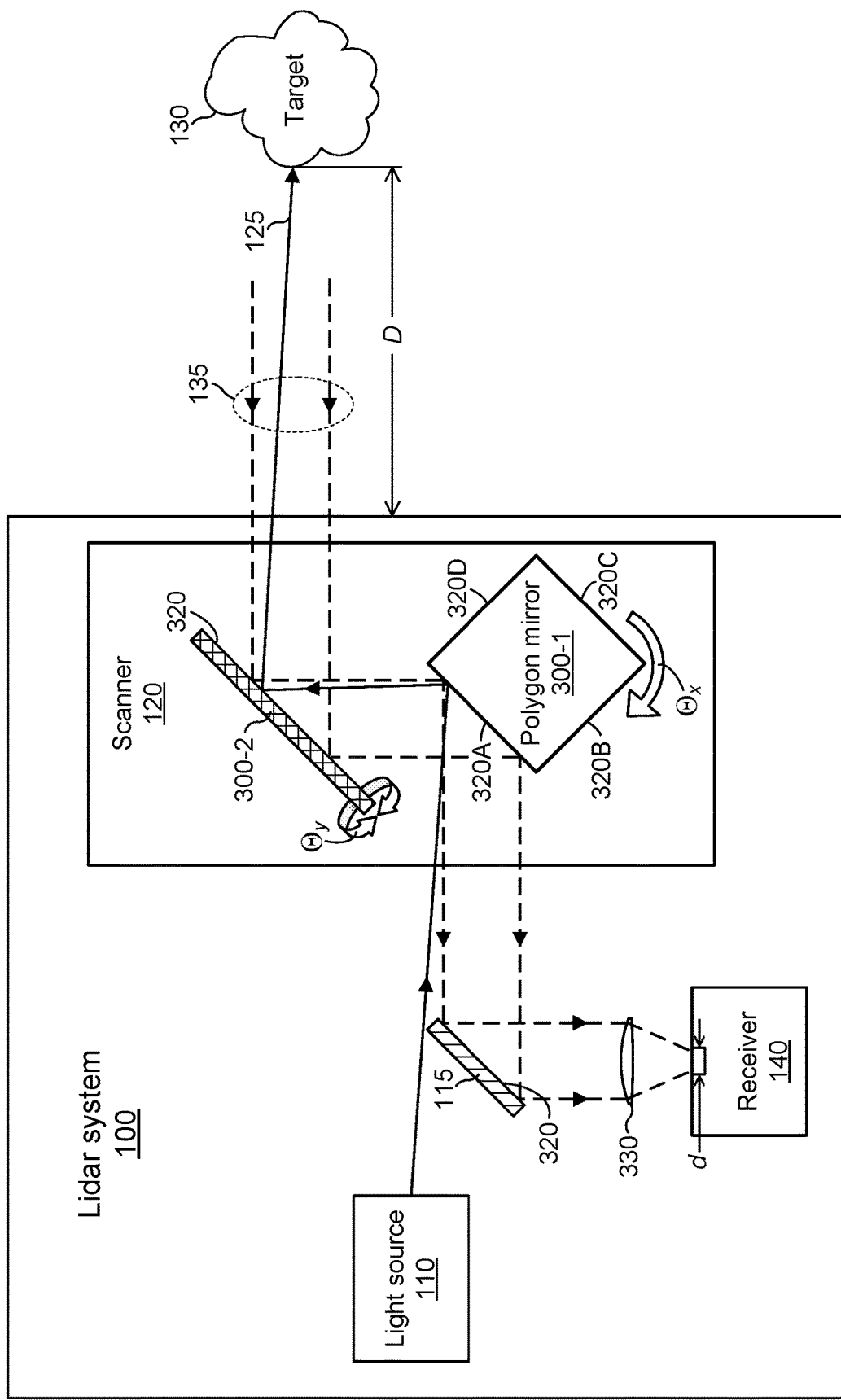
FIG. 4 illustrates an example lidar system with an example rotating polygon mirror.

FIG. 4 illustrates an example lidar system 100 with an example rotating polygon mirror 300-1. In particular embodiments, a scanner 120 may include a polygon mirror 300-1 configured to scan output beam 125 along a particular direction. In the example of FIG. 4, scanner 120 includes two scanning mirrors: (1) a polygon mirror 300-1 that rotates along the $\Theta_x$ direction and (2) a scanning mirror 300-2 that oscillates back and forth along the $\Theta_y$ direction. The output beam 125 from light source 110, which passes alongside mirror 115, is reflected by a reflecting surface (e.g., surface 320A, 320B, 320C, or 320D) of polygon mirror 300-1 and is then reflected by reflecting surface 320 of mirror 300-2. Scattered light from a target 130 returns to the lidar system 100 as input beam 135. The input beam 135 reflects from mirror 300-2, polygon mirror 300-1, and mirror 115, which directs input beam 135 through a focusing lens 330 and to receiver 140.

In particular embodiments, a polygon mirror 300-1 may be configured to rotate along a $\Theta_x$ or $\Theta_y$ direction and scan output beam 125 along a substantially horizontal or vertical direction, respectively. A rotation along a $\Theta_x$ direction may refer to a rotational motion of mirror 300-1 that results in output beam 125 scanning along a substantially horizontal direction. Similarly, a rotation along a $\Theta_y$ direction may refer to a rotational motion that results in output beam 125 scanning along a substantially vertical direction. In FIG. 4, mirror 300-1 is a polygon mirror that rotates along the $\Theta_x$ direction and scans output beam 125 along a substantially horizontal direction, and mirror 300-2 rotates along the $\Theta_y$ direction and scans output beam 125 along a substantially vertical direction. In particular embodiments, a polygon mirror 300-1 may be configured to scan output beam 125 along any suitable direction. As an example, a polygon mirror 300-1 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 300-1 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 300-1 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 4, the polygon mirror 300-1 has a substantially square cross-sectional shape and four reflecting surfaces (320A, 320B, 320C, and 320D). The polygon mirror 300-1 in FIG. 4 may be referred to as a square mirror, a cube mirror, or a four-sided polygon mirror. In FIG. 4, the polygon mirror 300-1 may have a shape similar to a cube, cuboid, or rectangular prism. Additionally, the polygon mirror 300-1 may have a total of six sides, where four of the sides are faces with reflective surfaces (320A, 320B, 320C, and 320D).

In particular embodiments, a polygon mirror 300-1 may be continuously rotated in a clockwise or counter-clockwise rotation direction about a rotation axis of the polygon mirror 300-1. The rotation axis may correspond to a line that is perpendicular to the plane of rotation of the polygon mirror 300-1 and that passes through the center of mass of the polygon mirror 300-1. In FIG. 4, the polygon mirror 300-1 rotates in the plane of the drawing, and the rotation axis of the polygon mirror 300-1 is perpendicular to the plane of the drawing. An electric motor may be configured to rotate a polygon mirror 300-1 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 300-1 may be mechanically coupled to an electric motor (e.g., a brushless DC motor or a synchronous electric motor) which is configured to spin the polygon mirror 300-1 at a rotational speed of approximately 160 Hz (or, 9600 revolutions per minute (RPM)).

In particular embodiments, output beam 125 may be reflected sequentially from the reflective surfaces (320A, 320B, 320C, and 320D) as the polygon mirror 300-1 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 300-1. In FIG. 4, the output beam 125 reflects off of reflective surface 320A to produce one scan line. Then, as the polygon mirror 300-1 rotates, the output beam 125 reflects off of reflective surfaces 320B, 320C, and 320D to produce a second, third, and fourth respective scan line.

In particular embodiments, output beam 125 may be directed to pass by a side of mirror 115 rather than passing through mirror 115. As an example, mirror 115 may not include an aperture 310, and the output beam 125 may be directed to pass along a side of mirror 115. In the example of FIG. 3, lidar system includes an overlap mirror 115 with an aperture 310 that output beam 125 passes through. In the example of FIG. 4, output beam 125 from light source 110 is directed to pass by mirror 115 (which does not include an aperture 310) and then to polygon mirror 300-1.

Figure 5:
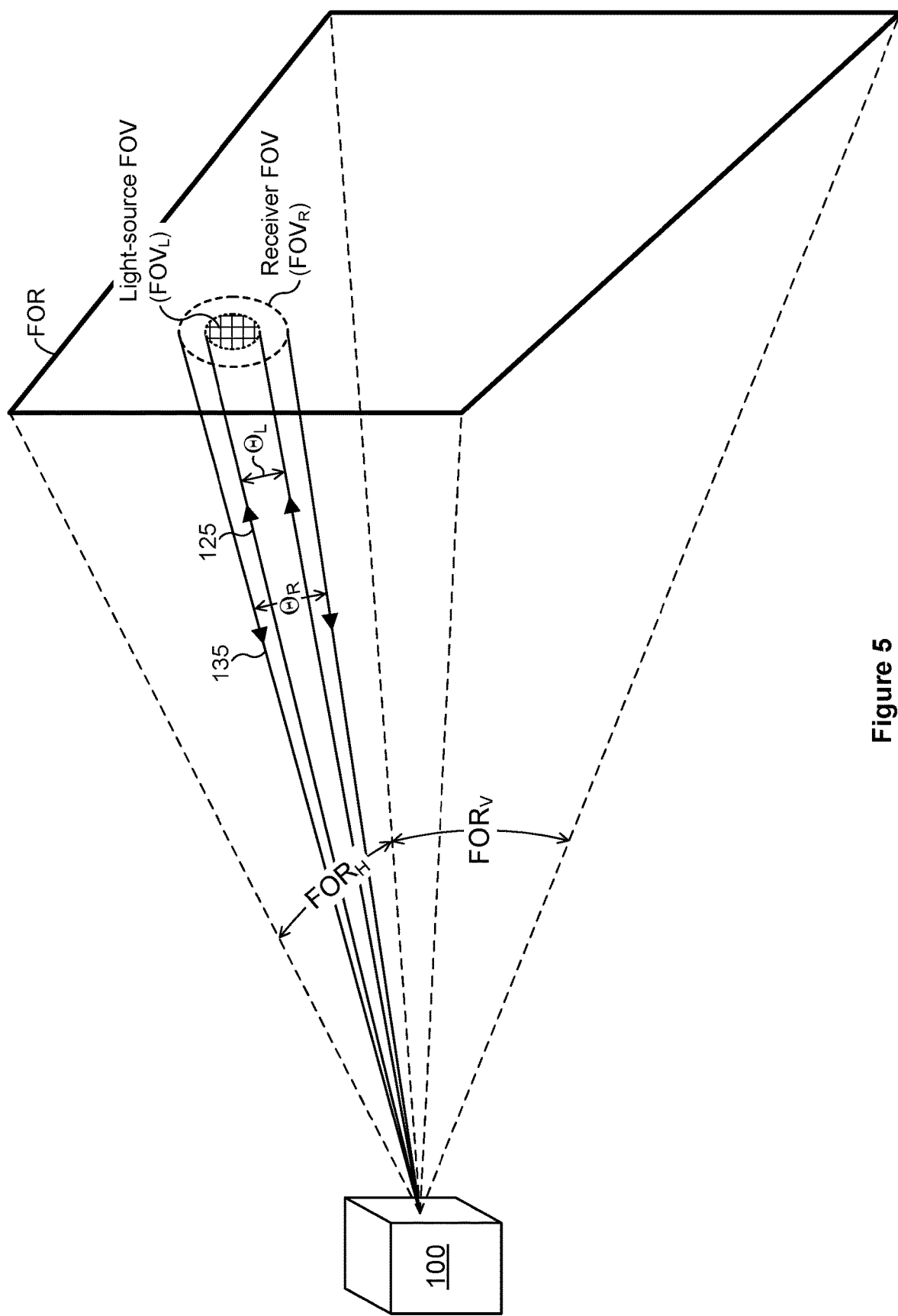
FIG. 5 illustrates an example light-source field of view and receiver field of view for a lidar system.

FIG. 5 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 5), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent OR that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad.

In particular embodiments, a pixel 210 may represent or may correspond to a light-source field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 6:
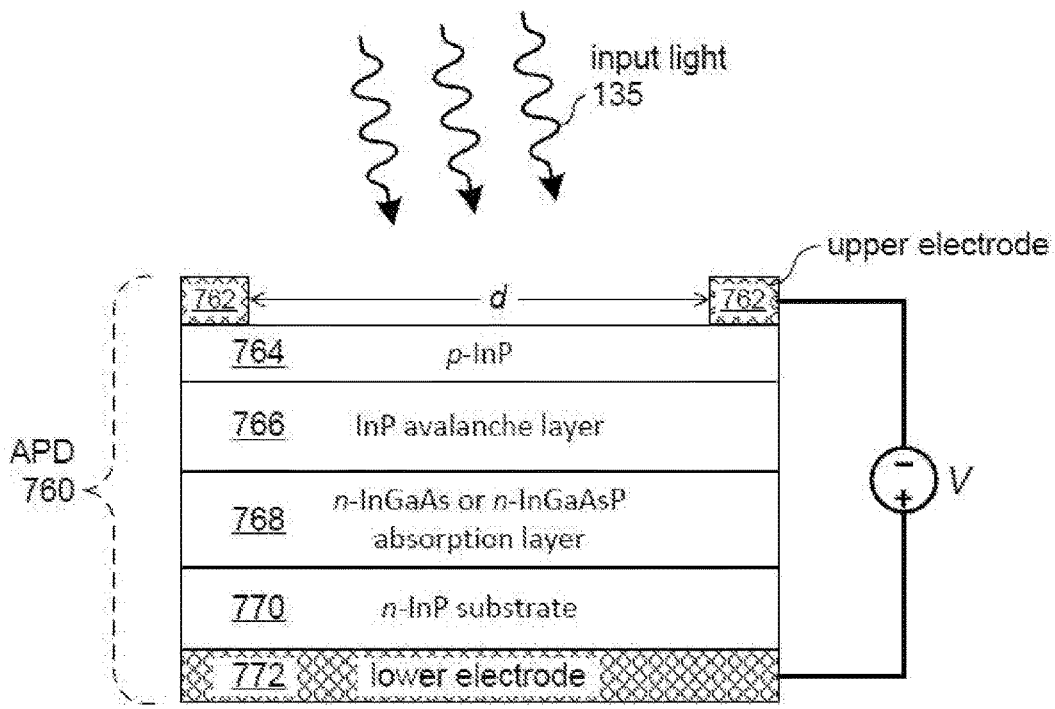
FIG. 6 illustrates an example InGaAs avalanche photodiode (APD).

FIG. 6 illustrates an example InGaAs avalanche photodiode (APD) 760. In particular embodiments, a receiver 140 may include one or more APDs 760 configured to receive and detect light from an input beam 135. In particular embodiments, an APD 760 may be configured to detect a portion of pulses of light which are scattered by a target 130 located downrange from lidar system 100. As an example, an APD 760 may receive a portion of a pulse of light scattered by a target 130, and the APD 760 may generate an electrical-current signal corresponding to the received pulse of light.

In particular embodiments, an APD 760 may include doped or undoped layers of any suitable semiconductor material, such as for example, silicon, germanium, InGaAs, InGaAsP, or indium phosphide (InP). Additionally, an APD 760 may include an upper electrode 762 and a lower electrode 772 for coupling the ADP 760 to an electrical circuit. As an example, the APD 760 may be electrically coupled to a voltage source that supplies a reverse-bias voltage V to the APD 760. Additionally, the APD 760 may be electrically coupled to a transimpedance amplifier which receives electrical current generated by the APD 760 and produces an output voltage signal that corresponds to the received current. The upper electrode 762 or lower electrode 772 may include any suitable electrically conductive material, such as for example a metal (e.g., gold, copper, silver, or aluminum), a transparent conductive oxide (e.g., indium tin oxide), a carbon-nanotube material, or polysilicon. In particular embodiments, the upper electrode 762 may be partially transparent or may have an opening to allow input light 135 to pass through to the active region of the APD 760. In FIG. 6, the upper electrode 762 may have a ring shape that at least partially surrounds the active region of the APD, where the active region refers to an area over which the APD 760 may receive and detect input light 135. The active region may have any suitable size or diameter d, such as for example, a diameter of approximately 25 μm, 50 μm, 80 μm, 100 μm, 200 μm, 500 μm, 1 mm, 2 mm, or 5 mm.

In particular embodiments, an APD 760 may include any suitable combination of any suitable semiconductor layers having any suitable doping (e.g., n-doped, p-doped, or intrinsic undoped material). In the example of FIG. 6, the InGaAs APD 760 includes a p-doped InP layer 764, an InP avalanche layer 766, an absorption layer 768 with n-doped InGaAs or InGaAsP, and an n-doped InP substrate layer 770. In particular embodiments, an APD 760 may include separate absorption and avalanche layers, or a single layer may act as both an absorption and avalanche region. An InGaAs APD 760 may operate electrically as a PN diode or a PIN diode, and during operation, the APD 760 may be reverse biased with a positive voltage V applied to the lower electrode 772 with respect to the upper electrode 762. The applied reverse-bias voltage V may have any suitable value, such as for example approximately 5 V, 10 V, 20 V, 30 V, 50 V, 75 V, 100 V, or 200 V.

In FIG. 6, photons of input light 135 may be absorbed primarily in the absorption layer 768, resulting in the generation of electron-hole pairs (which may be referred to as photo-generated carriers). As an example, the absorption layer 768 may be configured to absorb photons corresponding to the operating wavelength of the lidar system 100 (e.g., any suitable wavelength between approximately 1400 nm and approximately 1600 nm). In the avalanche layer 766, an avalanche-multiplication process occurs where carriers (e.g., electrons or holes) generated in the absorption layer 768 collide with the semiconductor lattice of the absorption layer 768, and produce additional carriers through impact ionization. This avalanche process can repeat numerous times so that one photo-generated carrier may result in the generation of multiple carriers. As an example, a single photon absorbed in the absorption layer 768 may lead to the generation of approximately 10, 50, 100, 200, 500, 1000, 10,000, or any other suitable number of carriers through an avalanche-multiplication process. The carriers generated in an APD 760 may produce an electrical current that is coupled to an electrical circuit which may perform signal amplification, sampling, filtering, signal conditioning, analog-to-digital conversion, time-to-digital conversion, pulse detection, threshold detection, rising-edge detection, or falling-edge detection.

In particular embodiments, the number of carriers generated from a single photo-generated carrier may increase as the applied reverse bias V is increased. If the applied reverse bias V is increased above a particular value referred to as the APD breakdown voltage, then a single carrier can trigger a self-sustaining avalanche process (e.g., the output of the APD 760 is saturated regardless of the input light level). In particular embodiments, an APD 760 that is operated at or above a breakdown voltage may be referred to as a single-photon avalanche diode (SPAD) and may be referred to as operating in a Geiger mode or a photon-counting mode. An APD 760 operated below a breakdown voltage may be referred to as a linear APD 760, a linear-mode APD, or an APD operating in linear mode, and the output current generated by the APD may be sent to an amplifier circuit (e.g., a transimpedance amplifier). In particular embodiments, receiver 140 may include an APD configured to operate as a SPAD and a quenching circuit configured to reduce a reverse-bias voltage applied to the SPAD when an avalanche event occurs in the SPAD. An APD 760 configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 760 may be coupled to a circuit that generates an electrical output pulse or edge when an avalanche event occurs.

In particular embodiments, an APD 760 or an APD 760 and a transimpedance amplifier may have a noise-equivalent power (NEP) that is less than or equal to 100 photons, 50 photons, 30 photons, 20 photons, or 10 photons. As an example, an InGaAs APD 760 may be operated as a SPAD and may have a NEP of less than or equal to 20 photons. As another example, an InGaAs APD 760 may be coupled to a transimpedance amplifier that produces an output voltage signal with a NEP of less than or equal to 50 photons. The NEP of an APD 760 is a metric that quantifies the sensitivity of the APD 760 in terms of a minimum signal (or a minimum number of photons) that the APD 760 can detect. In particular embodiments, the NEP may correspond to an optical power (or to a number of photons) that results in a signal-to-noise ratio of 1, or the NEP may represent a threshold number of photons above which an optical signal may be detected. As an example, if an APD 760 has a NEP of 20 photons, then an input beam 135 with 20 photons may be detected with a signal-to-noise ratio of approximately 1 (e.g., the APD 760 may receive 20 photons from the input beam 135 and generate an electrical signal representing the input beam 135 that has a signal-to-noise ratio of approximately 1). Similarly, an input beam 135 with 100 photons may be detected with a signal-to-noise ratio of approximately 5. In particular embodiments, a lidar system 100 with an APD 760 (or a combination of an APD 760 and transimpedance amplifier) having a NEP of less than or equal to 100 photons, 50 photons, 30 photons, 20 photons, or 10 photons may offer improved detection sensitivity with respect to a conventional lidar system that uses a PN or PIN photodiode. As an example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 100 with an InGaAs APD detector 760.

In particular embodiments, an optical filter located in front of receiver 140 may be configured to transmit light at one or more operating wavelengths of the light source 110 and attenuate light at surrounding wavelengths. As an example, an optical filter may be a free-space spectral filter located in front of APD 760. The spectral filter may transmit light at the operating wavelength of the light source 110 (e.g., between approximately 1530 nm and 1560 nm) and may attenuate light outside that wavelength range. As an example, light with wavelengths of approximately 400-1530 nm or 1560-2000 nm may be attenuated by any suitable amount, such as for example, by at least 5 dB, 10 dB, 20 dB, 30 dB, or 40 dB.

Figure 7:
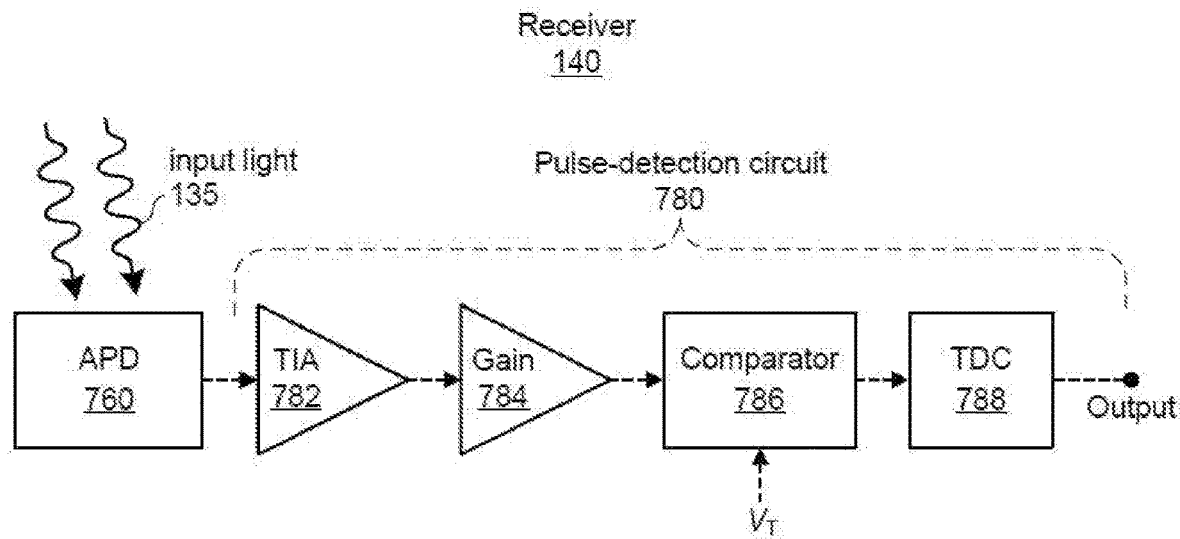
FIG. 7 illustrates an APD coupled to an example pulse-detection circuit.

FIG. 7 illustrates an APD 760 coupled to an example pulse-detection circuit 780. In particular embodiments, a pulse-detection circuit 780 may include circuitry that receives a signal from a detector (e.g., an electrical current from APD 760) and performs current-to-voltage conversion, signal amplification, sampling, filtering, signal conditioning, analog-to-digital conversion, time-to-digital conversion, pulse detection, threshold detection, rising-edge detection, or falling-edge detection. The pulse-detection circuit 780 may determine whether an optical pulse has been received by an APD 760 or may determine a time associated with receipt of an optical pulse by APD 760. In particular embodiments, a pulse-detection circuit 780 may include a transimpedance amplifier (TIA) 782, a gain circuit 784, a comparator 786, or a time-to-digital converter (TDC) 788. In particular embodiments, a pulse-detection circuit 780 may be included in a receiver 140 or a controller 150, or parts of a pulse-detection circuit 780 may be included in a receiver 140 and controller 150. As an example, a TIA 782 and a voltage-gain circuit 784 may be part of a receiver 140, and a comparator 786 and a TDC 788 may be part of a controller 150 that is coupled to the receiver 140.

In particular embodiments, a pulse-detection circuit 780 may include a TIA 782 configured to receive an electrical-current signal from an APD 760 and produce a voltage signal that corresponds to the received electrical-current signal. As an example, in response to a received optical pulse, an APD 760 may produce a current pulse corresponding to the optical pulse. A TIA 782 may receive the current pulse from the APD 760 and produce a voltage pulse that corresponds to the received current pulse. In particular embodiments, a TIA 782 may also act as an electronic filter. As an example, a TIA 782 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency). In particular embodiments, a pulse-detection circuit 780 may include a gain circuit 784 configured to amplify a voltage signal. As an example, a gain circuit 784 may include one or more voltage-amplification stages that amplify a voltage signal received from a TIA 782. For example, the gain circuit 784 may receive a voltage pulse from a TIA 782, and the gain circuit 784 may amplify the voltage pulse by any suitable amount, such as for example, by a gain of approximately 3 dB, 10 dB, 20 dB, 30 dB, 40 dB, or 50 dB. Additionally, the gain circuit 784 may also act as an electronic filter configured to remove or attenuate electrical noise.

In particular embodiments, a pulse-detection circuit 780 may include a comparator 786 configured to receive a voltage signal from TIA 782 or gain circuit 784 and produce an electrical-edge signal (e.g., a rising edge or a falling edge) when the received voltage signal rises above or falls below a particular threshold voltage $V_T$. As an example, when a received voltage rises above $V_T$, a comparator 786 may produce a rising-edge digital-voltage signal (e.g., a signal that steps from approximately 0 V to approximately 2.5 V, 3.3 V, 5 V, or any other suitable digital-high level). As another example, when a received voltage falls below $V_T$, a comparator 786 may produce a falling-edge digital-voltage signal (e.g., a signal that steps down from approximately 2.5 V, 3.3 V, 5 V, or any other suitable digital-high level to approximately 0 V). The voltage signal received by the comparator 786 may be received from a TIA 782 or gain circuit 784 and may correspond to an electrical-current signal generated by an APD 760. As an example, the voltage signal received by the comparator 786 may include a voltage pulse that corresponds to an electrical-current pulse produced by the APD 760 in response to receiving an optical pulse. The voltage signal received by the comparator 786 may be an analog signal, and an electrical-edge signal produced by the comparator 786 may be a digital signal.

In particular embodiments, a pulse-detection circuit 780 may include a time-to-digital converter (TDC) 788 configured to receive an electrical-edge signal from a comparator 786 and determine an interval of time between emission of a pulse of light by the light source 110 and receipt of the electrical-edge signal. The output of the TDC 788 may be a numerical value that corresponds to the time interval determined by the TDC 788. In particular embodiments, a TDC 788 may have an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. As an example, the TDC 788 may have an internal counter or clock with a 20 ps period, and the TDC 788 may determine that an interval of time between emission and receipt of a pulse is equal to 25,000 time periods, which corresponds to a time interval of approximately 0.5 microseconds. The TDC 788 may send the numerical value "25000" to a processor or controller 150 of the lidar system 100. In particular embodiments, a lidar system 100 may include a processor configured to determine a distance from the lidar system 100 to a target 130 based at least in part on an interval of time determined by a TDC 788. As an example, the processor may be an ASIC or FPGA and may be a part of controller 150. The processor may receive a numerical value (e.g., "25000") from the TDC 788, and based on the received value, the processor may determine the distance from the lidar system 100 to a target 130.

In particular embodiments, determining an interval of time between emission and receipt of a pulse of light may be based on determining (1) a time associated with the emission of the pulse by light source 110 or lidar system 100 and (2) a time when scattered light from the pulse is detected by receiver 140. As an example, a TDC 788 may count the number of time periods or clock cycles between an electrical edge associated with emission of a pulse of light and an electrical edge associated with detection of scattered light from the pulse. Determining when scattered light from the pulse is detected by receiver 140 may be based on determining a time for a rising or falling edge (e.g., a rising or falling edge produced by comparator 786) associated with the detected pulse. In particular embodiments, determining a time associated with emission of a pulse of light may be based on an electrical trigger signal. As an example, light source 110 may produce an electrical trigger signal for each pulse of light that is emitted, or an electrical device (e.g., function generator 420 or controller 150) may provide a trigger signal to the light source 110 to initiate the emission of each pulse of light. A trigger signal associated with emission of a pulse may be provided to TDC 788, and a rising edge or falling edge of the trigger signal may correspond to a time when a pulse is emitted. In particular embodiments, a time associated with emission of a pulse may be determined based on an optical trigger signal. As an example, a time associated with the emission of a pulse of light may be determined based at least in part on detection of a portion of light from the emitted pulse of light. The portion of light may be detected by a separate detector (e.g., a PIN photodiode or an APD 760) or by the receiver 140. A portion of light from an emitted pulse of light may be scattered or reflected from a surface (e.g., a surface of a beam splitter or a surface of light source 110, mirror 115, or scanner 120) located within lidar system 100. Some of the scattered or reflected light may be received by an APD 760 of receiver 140, and a pulse-detection circuit 780 coupled to the APD 760 may determine that a pulse has been received. The time at which the pulse was received may be associated with the emission time of the pulse. In particular embodiments, receiver 140 may include one APD 760 and one pulse-detection circuit 780 configured to detect a portion of an emitted pulse of light that is scattered or reflected from within the lidar system 100 as well a portion of the pulse of light that is subsequently scattered by a target 130. In particular embodiments, receiver 140 may include two APDs 760 and two pulse-detection circuits 780. One APD 760 and pulse-detection circuit 780 may detect a portion of an emitted pulse of light that is scattered or reflected from within the lidar system 100, and the other APD 760 and pulse-detection circuit 780 may detect a portion of the pulse of light scattered by a target 130.

In particular embodiments, a lidar system 100 may include a processor configured to determine a distance D from the lidar system 100 to a target 130 based at least in part on a round-trip time of flight for a pulse of light emitted by the light source 110 to travel from the lidar system 100 to the target 130 and back to the lidar system 100. In particular embodiments, a round-trip time of flight for a pulse of light may be determined based at least in part on a rising edge or a falling edge associated with the pulse of light detected by receiver 140. As an example, a pulse of light detected by receiver 140 may generate a current pulse in an APD 760, which results in a rising-edge signal produced by a comparator 786 coupled to the APD 760. In particular embodiments, a lidar system 100 may include a TDC 788 configured to determine a time interval between emission of a pulse of light by light source 110 and detection by receiver 140 of at least a portion of the pulse of light scattered by a target 130.

Figure 8:
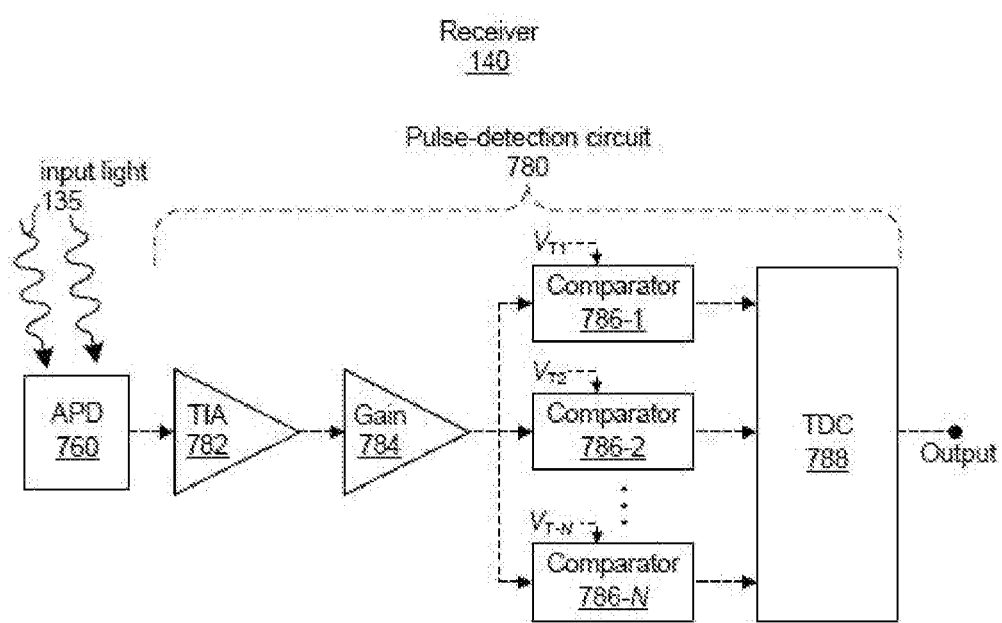
FIG. 8 illustrates an APD coupled to an example multi-channel pulse-detection circuit.

FIG. 8 illustrates an APD 760 coupled to an example multi-channel pulse-detection circuit 780. In particular embodiments, a multi-channel pulse-detection circuit 780 may include two or more comparators 786 and a TDC 788 with two or more input channels. In the example of FIG. 8, the multi-channel pulse detection circuit includes a TIA 782 that receives a current signal from APD 760 and a gain circuit 784 that boosts a voltage signal provided by TIA 782. The amplified voltage signal from the gain circuit 784 is sent to the N comparators (comparators 786-1, 786-2, . . . , 786-N), and each comparator is supplied with a particular reference or threshold voltage ($V_{T1}$, $V_{T2}$, . . . , $V_{TN}$). In particular embodiments, a multi-channel pulse-detection circuit 780 may include 2, 3, 4, 6, 8, 16, 32, 64, 128, or any other suitable number of comparators 786. As an example, a multi-channel pulse-detection circuit 780 may include N=8 comparators 786, and each comparator may be configured to provide a rising or falling edge to TDC 788 when a voltage signal provided by TIA 782 or gain circuit 784 rises above or falls below a particular threshold voltage $V_T$. For example, four of the comparators 786 may provide a rising edge when the voltage signal rises above 0.2 V, 0.4 V, 0.6 V, and 0.8 V, respectively, and the other four comparators 786 may provide a falling edge when the voltage signal falls below 0.2 V, 0.4 V, 0.6 V, and 0.8 V, respectively. A multi-channel pulse-detection circuit 780 may provide additional information about a received pulse of light, such as for example, a shape of the pulse, a duration of the pulse, or timing information about the rising edge, falling edge, or peak of the pulse.

In particular embodiments, a multi-channel pulse-detection circuit 780 may include two comparators (786-1, 786-2). The first comparator 786-1 may produce a first electrical-edge signal when a voltage signal provided by TIA 782 or gain circuit 784 rises above a threshold voltage $V_{T1}$. The second comparator 786-2 may produce a second electrical-edge signal when the voltage signal falls below a threshold voltage $V_{T2}$. The threshold voltages $V_{T1}$ and $V_{T2}$ may be the same or may be different voltages. As an example, if $V_{T1}$ and $V_{T2}$ are the same, the edge from the first comparator 786-1 may correspond to a particular level of a rising edge of a received pulse, and the edge from the second comparator 786-2 may correspond to the same level of a falling edge of the received pulse. Additionally, the time difference between the two edges may represent a width or duration of the pulse. In particular embodiments, a multi-channel pulse-detection circuit 780 may include a TDC 788 configured to receive the first and second electrical-edge signals from comparators 786-1 and 786-2, respectively. The TDC 788 may determine a duration of the received pulse of light based on a time difference between receipt of the first and second electrical-edge signals. The TDC 788 may determine a first interval of time between emission of the pulse of light by the light source 110 and receipt of the first electrical-edge signal by the TDC 788. Additionally, the TDC 788 may determine a second interval of time between emission of the pulse of light and receipt of the second electrical-edge signal. The TDC 788 may determine a time associated with a peak of the received pulse of light based at least in part on the first and second electrical-edge signals (e.g., the peak may be located approximately midway between the times associated with the first and second electrical-edge signals). In particular embodiments, a processor or controller 150 may determine a distance from the lidar system 100 to a target 130 based at least in part on a duration of a received pulse of light, a shape of a received pulse of light, a first or second interval of time associated with a rising or falling edge, respectively, of a received pulse of light, or a time associated with a peak of a received pulse of light.

The accuracy and reliability of a lidar system are important considerations, particularly when the lidar system is being used for guidance in an autonomous vehicle. In real world operational environments, a lidar system may encounter interference which has the potential to reduce the system's accuracy or reliability. For example, while in use in an autonomous vehicle, a lidar system may detect crosstalk pulses which originate from other lidar systems being used by other vehicles on the road. If the lidar system in question mistakes these crosstalk pulses for returns of its own transmitted pulses, there is a possibility that the accuracy of its distance measurements may be negatively impacted. It would therefore be advantageous for lidar system 100 to be capable of operating through this type of interference by distinguishing between its own pulses and crosstalk pulses from other lidar systems.

Further, it is an unfortunate reality that lidar systems, such as those used in autonomous vehicles, may be subject to intentional or malicious attacks intended to cause interference or even damage. For example, a hostile source may emit powerful jamming pulses as a means of corrupting a lidar system's measurements or even attempting to destroy the lidar system's detector. Jamming pulses therefore also have the potential to negatively impact the accuracy or reliability of a lidar system. Thus, it would be advantageous for lidar system 100 to be capable of not only distinguishing such jamming pulses, but also protecting its detector 760 from the damage which those pulses could cause.

This disclosure describes processing techniques which can be used to improve the accuracy and reliability of lidar system 100 while operating in the presence of crosstalk or jamming pulses. But there are also hardware solutions which can make lidar system 100 less susceptible to the effects of such pulses. For example, as already mentioned, receiver 140 of lidar system 100 may be optically designed to have a field of view less than or equal to approximately 5 mrad, 3 mrad, 2 mrad, 1.5 mrad, 1 mrad, 0.5 mrad, 0.2 mrad, or 0.1 mrad. By scanning the field of view of receiver 140 across a field of regard, as discussed herein, and by limiting the field of view of receiver 140 to a relatively small angular space, the probability of detecting a given crosstalk pulse or jamming pulse is greatly reduced. In order for a crosstalk pulse or a jamming pulse to have any impact on lidar system 100 under such circumstances, the pulse would need to be emitted from a location within the field of regard at the precise instant when scanner 120 was aiming the field of view of receiver 140 at that location. Lidar system 100 therefore can have far less susceptibility to crosstalk or jamming pulses than non-scanning lidar systems or scanning lidar systems with larger receiver fields of view. In addition, lidar system 100 can implement processing techniques to further reduce its susceptibility to crosstalk pulses or jamming pulses. One example technique is illustrated in FIG. 9.

Figure 9:
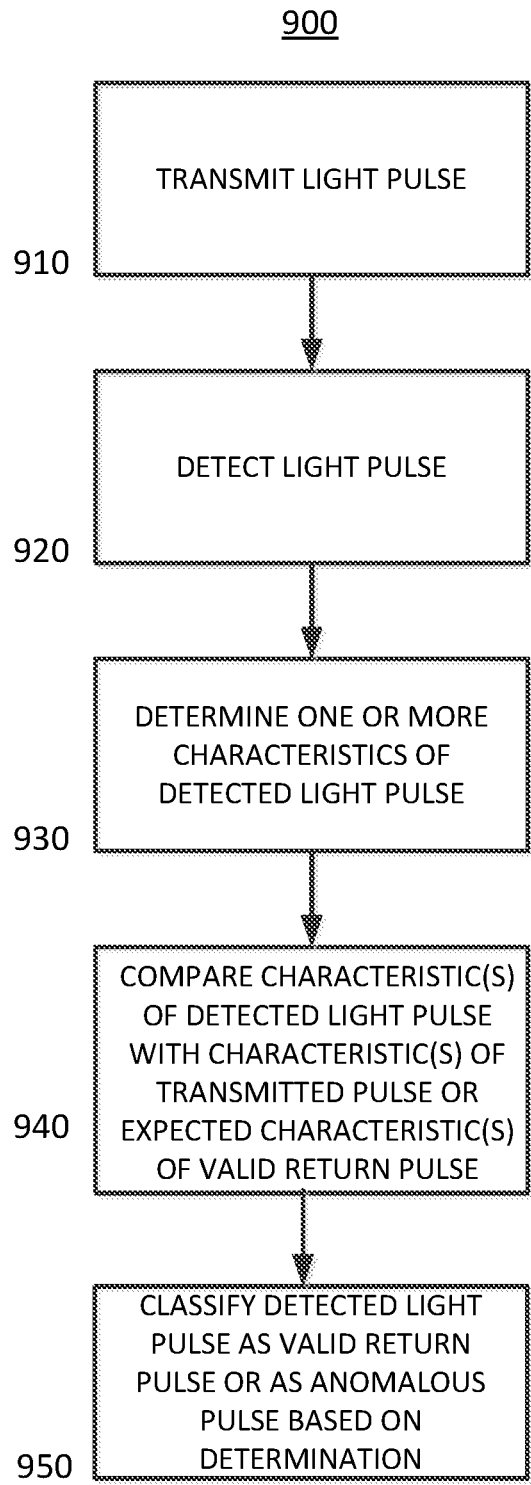
FIG. 9 illustrates an example method which a lidar system can use to distinguish its own pulses from crosstalk pulses emitted by other lidar systems or from jamming pulses emitted by a hostile source.

FIG. 9 illustrates an example method 900 which lidar system 100 can use to distinguish its own pulses from crosstalk pulses emitted by other lidar systems or from jamming pulses emitted by a hostile source. The method 900 begins at block 910, where lidar system 100 outputs a pulse of light. The transmitted pulse of light can be provided with one or more representative characteristics. These can include, for example, a representative wavelength, magnitude peak power, pulse energy, pulse width, and/or pulse shape.

At block 920, a light pulse is detected. This detected light pulse may be a return pulse from lidar system 100, or it may be a crosstalk pulse or jamming pulse emitted by another lidar system or by a hostile source. At block 930, lidar system 100 determines one or more characteristics of the detected light pulse, such as its wavelength, magnitude (e.g., a voltage induced by the detected pulse at a given time), energy, pulse width, and/or pulse shape. In some embodiments, these characteristics of the detected pulse can be measured or defined in a consistent manner with the corresponding representative characteristics of the transmitted pulse. The characteristics of the detected light pulse can be measured or otherwise determined using, for example, pulse detection circuit 780. The width of the pulse may be determined as the time between a rising-edge signal and a falling-edge signal generated by comparator 786. The magnitude and/or shape of the detected pulse can be determined using one or more comparators 786-N with various threshold voltages, as discussed with respect to FIG. 8. In another embodiment, the characteristics of the pulse may be measured by a comparator, as described in more detail with respect to FIG. 13.

Then, at block 940, lidar system 100 can compare the characteristic(s) of the detected light pulse with the corresponding representative characteristic(s) of the transmitted light pulse or the expected characteristic(s) of a valid return pulse. If the detected light pulse is one which originated at lidar system 100 itself, then its characteristic(s) will typically bear a distinguishable relationship to the representative characteristic(s) of the transmitted light pulse or the expected characteristic(s) of a valid return pulse. For example, the wavelength, pulse width, and pulse shape may be the same as, or otherwise correlated, with the wavelength, pulse width, and pulse shape of the transmitted light pulse. If the wavelength, pulse width, or pulse shape of the detected pulse does not match—to a selected degree—that of the transmitted light pulse or that which is expected of a valid return pulse, then lidar system 100 can classify the detected pulse as an anomalous pulse. Meanwhile, if the detected light pulse originated from lidar system 100, its magnitude or energy will be expected to be less than the magnitude or energy of the transmitted light pulse, or more particularly, to fall within a certain range of values as a result of typical propagation, spreading, reflection, and/or scattering losses. Thus, if the magnitude or energy of the detected pulse is not less than—by a selected amount—that of the transmitted pulse or that which is expected of a valid return pulse, then lidar system 100 can classify the detected pulse as an anomalous pulse. In contrast, if the detected light pulse originated from another lidar system, or from a hostile source, any of the foregoing pulse characteristics may differ from the corresponding representative characteristic(s) of the transmitted light pulse, or the expected characteristic(s) of a valid return pulse, by more than a selected amount, which can be specified based on experimental testing and/or theoretical calculations.

Finally, at block 950, lidar system 100 classifies the detected light pulse as a valid return pulse or as an anomalous pulse based on the comparison performed at block 940. If the characteristic(s) of the detected light pulse are deemed to sufficiently match the representative characteristic(s) of the transmitted pulse or the expected characteristic(s) of a valid return pulse, based on any suitable test or criterion, then the detected light pulse is classified as a valid pulse and it can be used by lidar system 100 to determine a distance measurement or to perform any other task which lidar system 100 performs using valid detected pulses. On the other hand, if one or more of the characteristic(s) of the detected light pulse are deemed not to sufficiently match the representative characteristic(s) of the transmitted pulse or the expected characteristic(s) of a valid return pulse, then the detected light pulse can be identified as an anomalous pulse and can be disregarded or flagged to eliminate or reduce the reliance of lidar system 100 on that pulse. For example, lidar system 100 may be programmed to not calculate, or to not output, a distance measurement using the anomalous pulse. Or lidar system 100 may be programmed to flag any distance measurement calculated using the anomalous pulse as potentially being unreliable or to select the anomalous pulse, or any information determined therefrom, to undergo an additional test in an attempt to determine its reliability.

While the method 900 shown in FIG. 9 is capable of distinguishing valid return light pulses from anomalous pulses, such as crosstalk pulses or jamming pulses, it may also be advantageous to distinguish between different types of anomalous pulses. Furthermore, it may be advantageous to do more than simply identify an anomalous pulse. For example, it may be advantageous, particularly in the case of jamming pulses, for lidar system 100 to take action to protect one or more of its components from possible damaging effects of such a pulse. These benefits can be achieved according to the method illustrated in FIG. 10.

Figure 10:
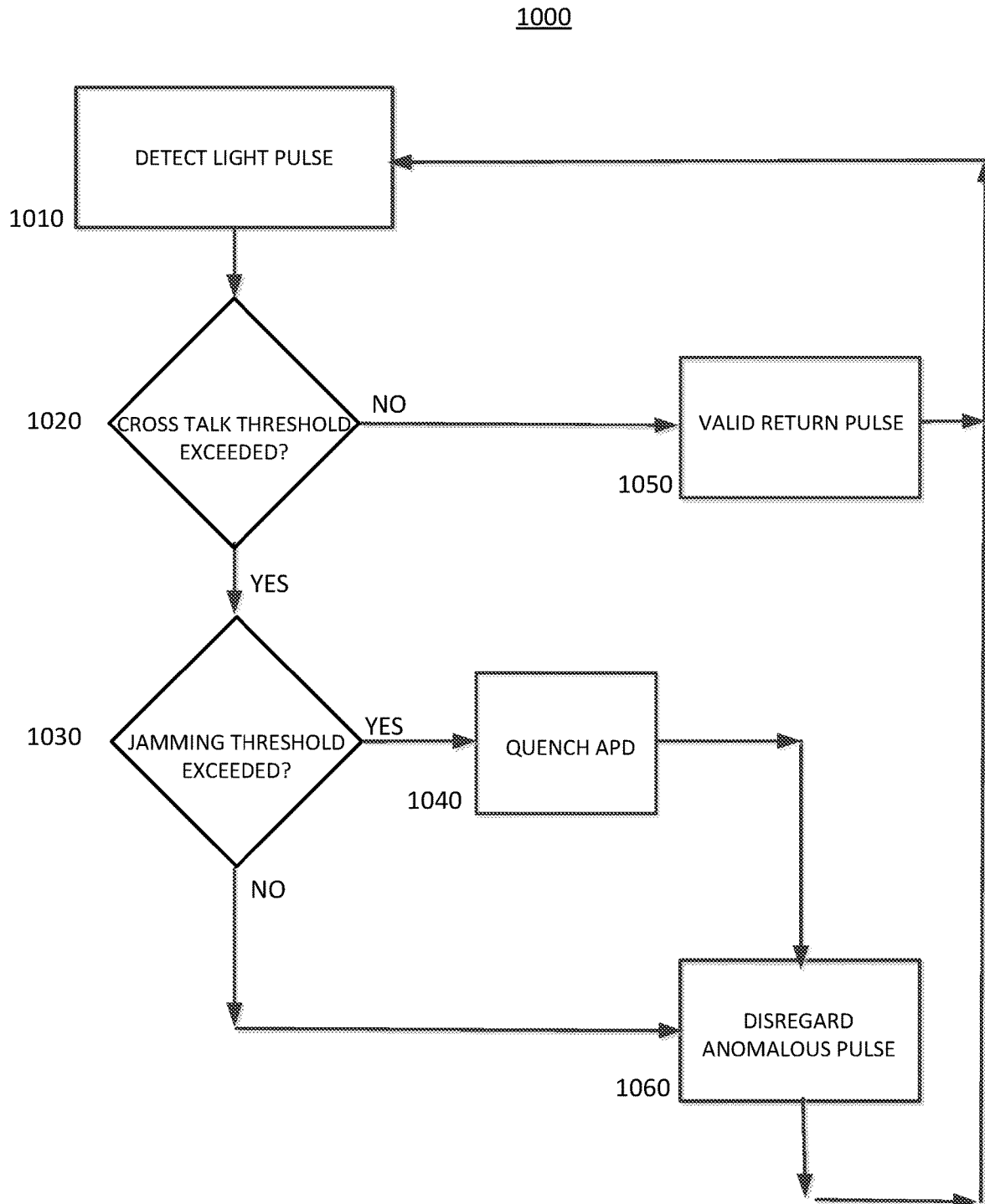
FIG. 10 illustrates an example method which a lidar system can use to distinguish between different types of anomalous pulses and to take action to protect itself from damage when a particular type of anomalous pulse is identified.

FIG. 10 illustrates an example method 1000 which lidar system 100 can use to distinguish between different types of anomalous pulses and to take action to protect itself from damage when a particular type of anomalous pulse is identified. For example, in some embodiments, the method 1000 can be used by lidar system 100 to distinguish between crosstalk pulses and jamming pulses, and to take protective action when a jamming pulse is identified.

The method 1000 begins at block 1010 where lidar system 100 detects a light pulse. As already discussed, if the detected light pulse originated from lidar system 100, then it will be expected to have a magnitude within some range of values less than the magnitude of the original transmitted light pulse. Conversely, it is possible that a crosstalk pulse or a jamming pulse may have a magnitude which is greater than the expected range of magnitudes of a valid return pulse, or possibly even greater than the original magnitude of the light pulse transmitted by lidar system 100. This can occur because a crosstalk pulse or a jamming pulse may be emitted with a larger magnitude than a valid transmitted light pulse to begin with. It can also occur because a crosstalk pulse or a jamming pulse may be detected by lidar system 100 directly without having incurred scattering, reflection, and/or round trip propagation or spreading losses. The method 1000 can therefore distinguish between valid return pulses, crosstalk pulses, and jamming pulses based on these different types of pulses having different magnitudes.

The method 1000 continues to decision block 1020 where lidar system 100 determines whether the magnitude of the detected light pulse exceeds a crosstalk threshold. The specific crosstalk threshold can be determined experimentally and/or theoretically based on, for example, the magnitudes of pulses transmitted by other commercially available lidar systems. In some cases, the crosstalk threshold can be set to a value that is larger than the magnitude of a valid light pulse transmitted by lidar system 100. Any detected pulse having a magnitude greater than that of a pulse transmitted by lidar system 100 itself can be determined with certainty to have originated from a source other than lidar system 100. Further, in some cases, the crosstalk threshold can be set to a value that is less than or equal to the magnitude of a pulse that just satisfies a legally imposed eye safety limit. This is true because it can typically be assumed that commercially available lidar systems will operate in accordance with applicable eye safety regulations. In some embodiments, the crosstalk threshold may be set at a level so as to be exceeded by a pulse of 0.5 µJ or more. Lidar system 100 can determine whether the detected by pulse exceeds the crosstalk threshold using, for example, a pulse detection circuit, as illustrated in FIGS. 11A and 11B.

Figure 11A:
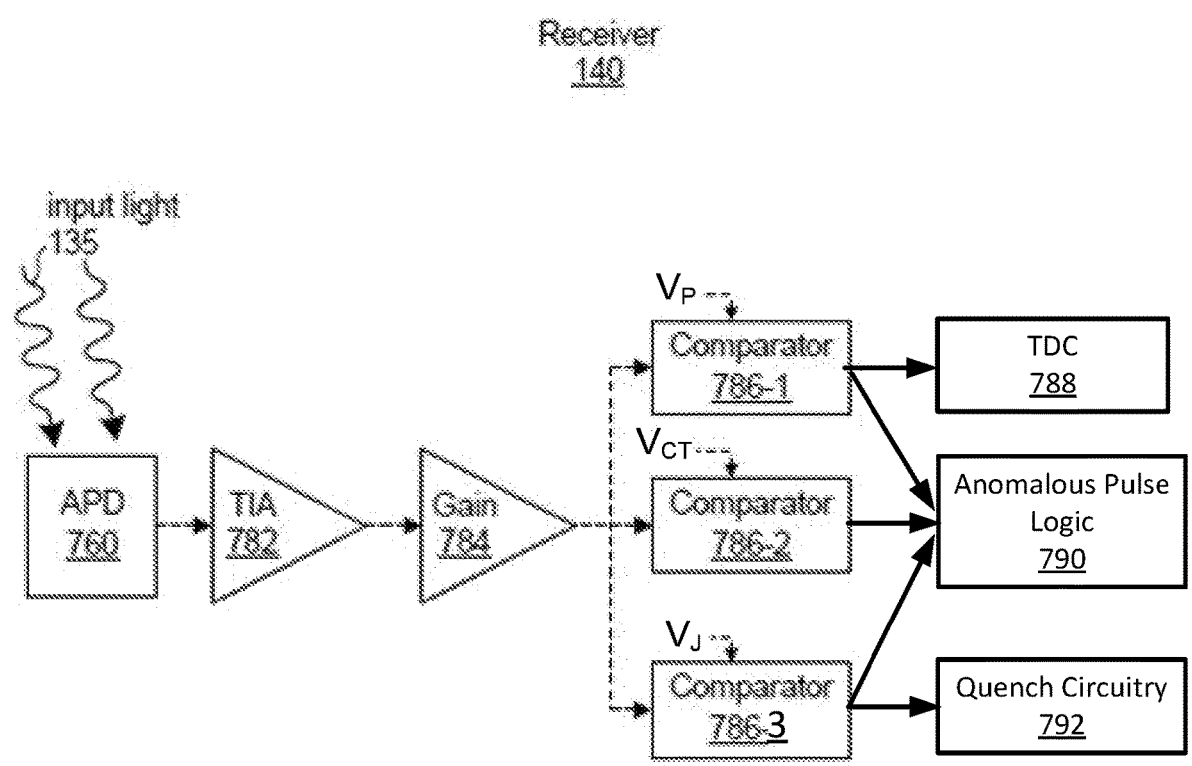
FIG. 11A illustrates an example embodiment of a receiver which includes a pulse detection circuit that can distinguish between valid return light pulses and different types of anomalous pulses.

FIG. 11A illustrates an example embodiment of receiver 140 which includes a pulse detection circuit that can distinguish between valid return light pulses and different types of anomalous pulses. The receiver 140 can receive input light 135 at APD 760. The output of APD 760 can be connected to transimpedance amplifier 782, which can convert the detector output current into a voltage signal. The output of transimpedance amplifier 782 may be connected to an amplifier 784, which amplifies the detector voltage signal. The output from amplifier 784 can then be connected to a bank of comparators 786-1, 786-2, 786-3.

Each of the comparators 786-1, 786-2, 786-3 can generate an output signal when the comparator input rises above a threshold voltage. For example, comparator 786-1 can have a threshold voltage, VP, which may correspond to the minimum magnitude of a detectable valid return light pulse which originated from lidar system 100. Comparator 786-1 can therefore generate an output signal when a potentially valid light pulse has been detected. This output signal can be provided to a TDC 788 to determine a distance measurement associated with the detected pulse, as discussed herein. Meanwhile, comparator 786-2 can have a threshold voltage, $V_{CT}$, which corresponds to the crosstalk threshold referenced in decision block 1020 of FIG. 10. Comparator 786-2 can therefore generate an output signal when a potential crosstalk pulse has been detected.

Figure 11B:
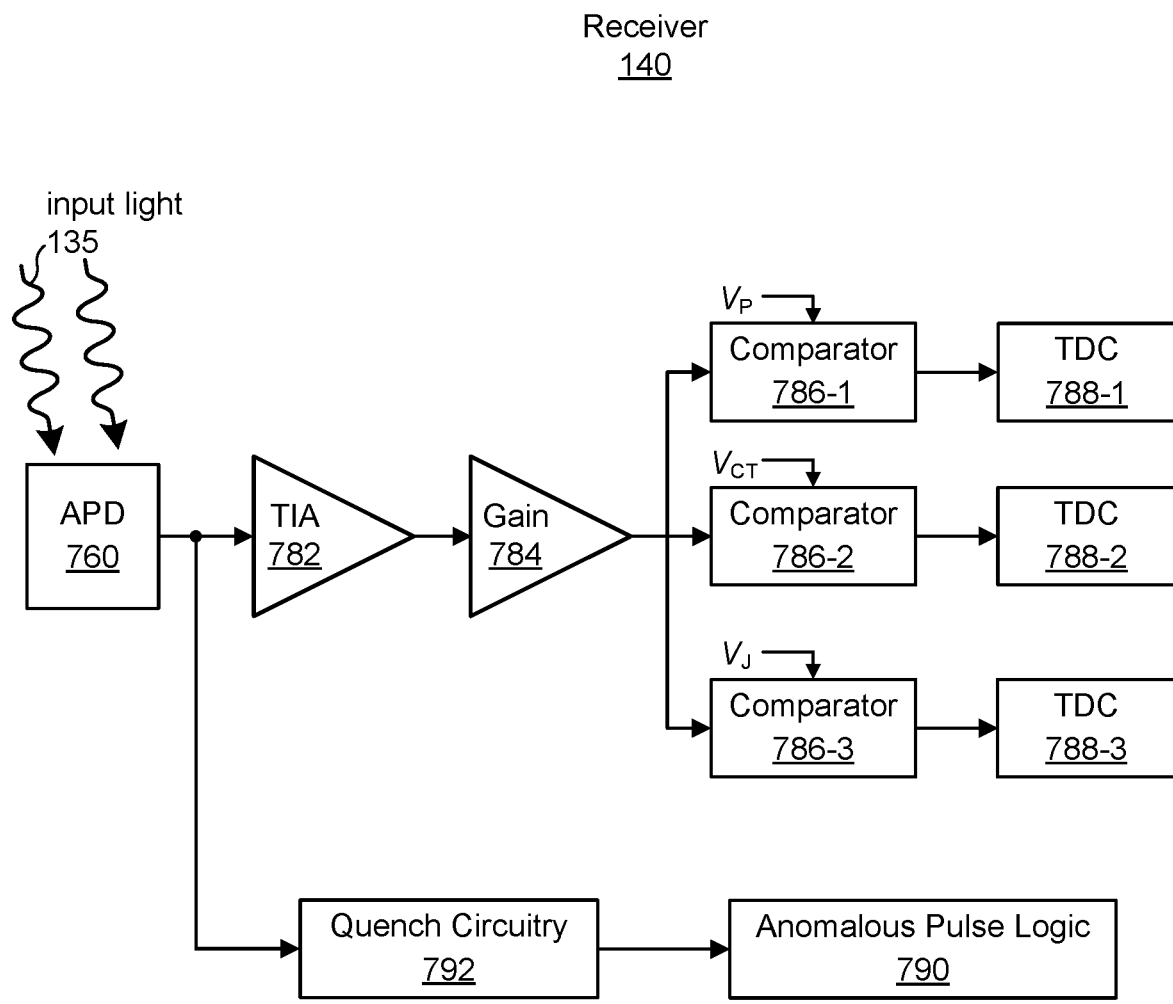
FIG. 11B illustrates another example embodiment of a receiver which includes a pulse detection circuit that can distinguish between valid return light pulses and different types of anomalous pulses.

FIG. 11B illustrates another example embodiment of receiver 140 which includes a pulse detection circuit that can distinguish between valid return light pulses and different types of anomalous pulses. As in FIG. 11A, the receiver 140 can receive input light 135 at APD 760. The output of APD 760 can be connected to transimpedance amplifier 782, as in FIG. 11A, but can be connected to quench circuitry 792 as well. In this embodiment, comparator 786-2 can serve the same function as in FIG. 11A and can generate an output signal when a potential crosstalk pulse has been detected. In some embodiments, the output signal can be directed to both the TDC 788-2 as well as to the anomalous pulse logic 790 (not shown). In other embodiments, the output signal can be directed to only the anomalous pulse logic 790, and not to TDC 788-2.

If the detected light pulse does not exceed the crosstalk threshold at decision block 1020, then the method 1000 proceeds to block 1050 where the detected light pulse can be determined to be a valid return light pulse. The method 1000 then returns back to block 1010 to detect the next light pulse. If, however, the detected light pulse does exceed the crosstalk threshold at decision block 1020, then the method proceeds to decision block 1030 where lidar system 100 determines whether the detected light pulse also exceeds a jamming threshold. The jamming threshold can be set experimentally and/or theoretically at a level which is greater than the crosstalk threshold but at or below a level corresponding to a pulse magnitude which has the capability to cause damage to lidar system 100. In some embodiments, the jamming threshold may be set at a level so as to be exceeded by a pulse of 10 µJ or more. A pulse magnitude above the jamming threshold may create an avalanche current within APD 760 that is large enough to damage the APD. The mode by which this may occur is as follows.

An APD may include a reverse biased p-n junction. In some embodiments, APD 760 is operated in linear mode with a reverse bias voltage that is less than the breakdown voltage of the APD. In this mode, the current generated in APD 760 may be in proportion to the number of photons that are incident upon the APD. As already discussed herein, when photons are incident upon the APD, they can mobilize charge carriers (i.e., electron-hole pairs) via the photoelectric effect. These photo-generated charge carriers can then be accelerated by the reverse bias voltage and can mobilize additional charge carriers via impact ionization. This process may repeat such that one photo-generated charge carrier may result in the generation of multiple additional charge carriers, thus leading to an avalanche current. If the number of photons is too high, as in the case of a detected pulse with a magnitude greater than the jamming threshold, then the resulting avalanche current in the APD can cause irreversible damage to the APD.

With reference to FIG. 11A, comparator 786-3 can have a threshold voltage, $V_J$, which corresponds to the jamming threshold referenced in decision block 1030 of FIG. 10. Comparator 786-3 therefore generates an output signal when a jamming pulse has been detected. If the detected light pulse exceeds the jamming threshold at decision block 1030, then the method 1000 proceeds to block 1040 where lidar system 100 quenches APD 760 so as to avoid damage to the detector. The number of additional charge carriers mobilized by each photo-generated charge carrier in APD 760 may decrease as the reverse bias voltage is decreased. Hence, reducing the applied reverse bias voltage can halt the avalanche process, thereby quenching and protecting the APD. As shown in FIG. 11A, the output of comparator 786-3 can be connected to quench circuitry 792. Accordingly, when a jamming pulse is detected by comparator 786-3, it generates an output signal which then causes the quench circuitry 792 to quench APD 760. An example embodiment of the quench circuitry 792 is discussed further below.

With reference to FIG. 11B, the jamming threshold comparator may be part of quench circuitry 792. The quench circuitry 792 may be configured to detect when the light pulse received by the APD 760 exceeds the jamming threshold at decision block 1030, and to quench the APD 760 in decision block 1040 to avoid damage to the detector. In some embodiments, quench circuitry 792 can be the quench circuit shown in FIG. 13.

After quenching the APD at block 1040, the method 1000 proceeds to block 1060 where the detected light pulse is identified as an anomalous pulse and is disregarded, as discussed above with respect to block 950 of FIG. 9. If, however, the detected light pulse does not exceed the jamming threshold at decision block 1030, then the method 1000 proceeds directly to block 1060 without needing to have quenched the APD. After block 1060, the method 1000 returns back to block 1010 and begins again with the detection of the next pulse of light. FIG. 10 illustrates both crosstalk detection and jamming detection, but embodiments of lidar systems could use either detection mechanism separately, or could use both together.

As shown in FIG. 11A, the outputs of comparators 786-1, 786-2, 786-3 can be connected to the anomalous pulse logic 790. The anomalous pulse logic 790 can be a hardware, software, or firmware module which determines when lidar system 100 should classify a detected pulse as an anomalous pulse. For example, if the anomalous pulse logic 790 receives an output signal only from comparator 786-1, then it can determine that a pulse was detected but that it did not exceed the crosstalk threshold or the jamming threshold. Accordingly, the detected pulse can be classified as a valid return pulse. If, however, the anomalous pulse logic 790 receives output signals from comparator 786-1 and comparator 786-2 but not comparator 786-3, then it can classify the detected pulse as a crosstalk pulse and initiate appropriate action to disregard that particular pulse. Finally, if the anomalous pulse logic 790 receives output signals from comparator 786-1, comparator 786-2, and comparator 786-3, then it can classify the detected pulse as a jamming pulse and initiate appropriate action to disregard the pulse. In addition, in some embodiments, when lidar system 100 identifies a jamming pulse, it can output a notification to warn other devices and/or the appropriate authorities of a possible hostile source.

In the embodiment shown in FIG. 11B, the output of the quench circuitry 792 can be connected to the anomalous pulse logic 790. When the quench circuitry 792 detects a pulse exceeding the jamming threshold, quench circuitry 792 can quench the APD 760 and indicate to the anomalous pulse logic 790 that a jamming signal was detected. In some embodiments, the anomalous pulse logic 790 receives an indication of an anomalous pulse from quench circuit 792, and not from the crosstalk threshold comparator 786-2. In other embodiments, the output of comparator 786-2 may be passed to anomalous pulse logic 790 as well.

Figure 12A:
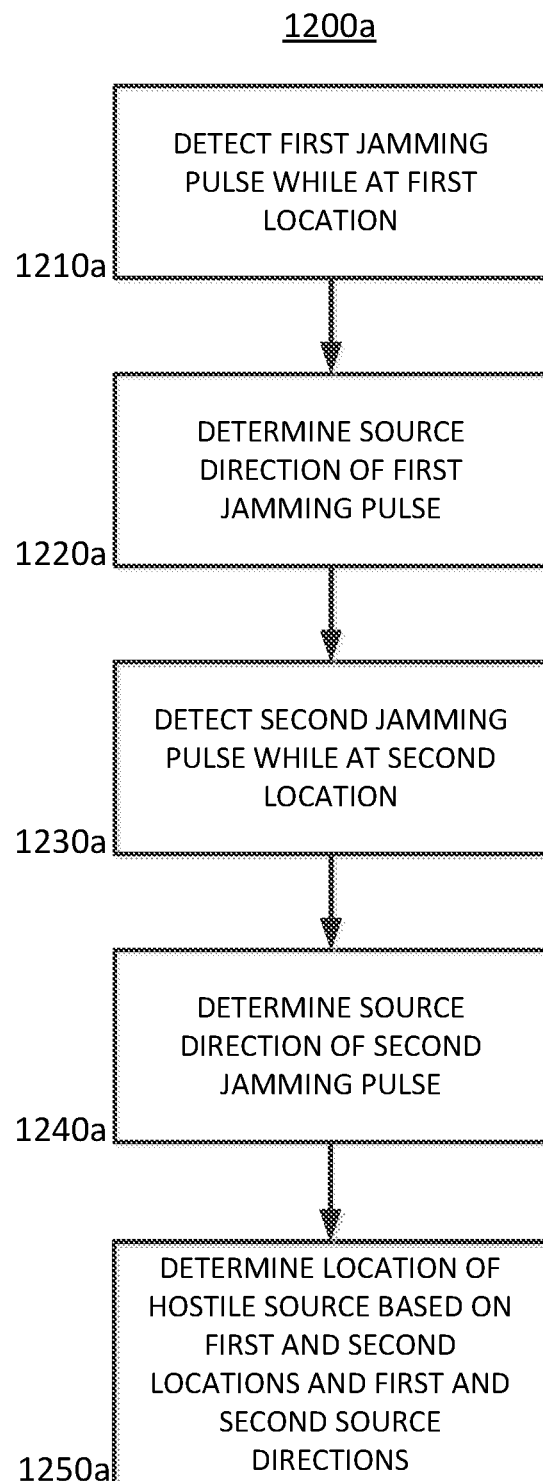
FIG. 12A illustrates a first example method by which a lidar system can determine the location of a hostile source based on detection of a jamming pulse.
Figure 12B:
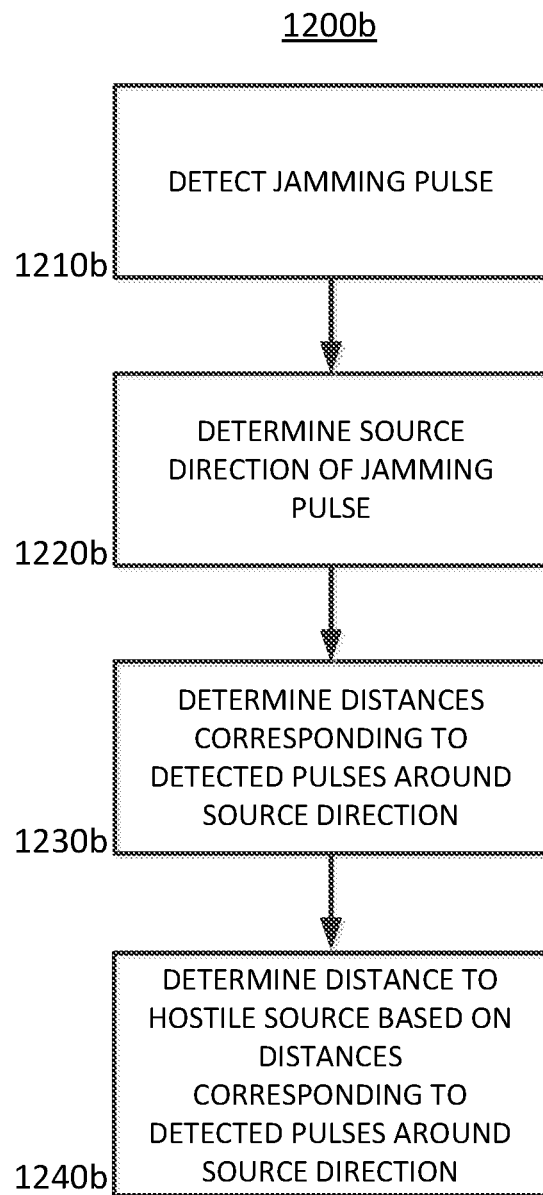
FIG. 12B illustrates a second example method by which a lidar system can determine the location of a hostile source based on detection of a jamming pulse.

Lidar system 100 can also attempt to determine the location of the hostile source according to the methods shown in FIGS. 12A and 12B. FIG. 12A illustrates a first example method 1200a by which lidar system 100 can determine the location of a hostile source based on detection of a jamming pulse. The method 1200a can be used when lidar system 100 is mounted to a mobile platform, such as an autonomous vehicle. The method 1200a begins at block 1210a where lidar system 100 detects a first jamming pulse according to, for example, the techniques described herein. The first jamming pulse is detected while lidar system 100 is at a first location. The first location can be determined using, for example, a global positioning system (GPS) integrated with the autonomous vehicle. At block 1220a, lidar system 100 determines the source direction of the first jamming pulse. This can be done by, for example, determining the angular location within the field of regard from which the jamming pulse was detected. This angular location can be determined based on the state of scanner 120 when the jamming pulse was received.

At block 1230a, lidar system 100 detects a second jamming pulse while located at a new second location. For example, if lidar system 100 is mounted to an autonomous vehicle, the vehicle may move some distance between the time the first jamming pulse was detected from the hostile source and the time scanner 120 returns its aim point again to the location of the hostile source while executing a scan pattern. After detecting a second jamming pulse from the hostile source while at the second location, the method 1200a continues to block 1240a where lidar system 100 determines the source direction of the second jamming pulse. This source direction determination can be performed in the same manner as discussed with respect to block 1220a. And, the second location can likewise be determined using the GPS unit.

Finally, at block 1250a, lidar system 100 can determine the location of the hostile source which is emitting jamming pulses. The location of the hostile source can be triangulated using the first and second locations of lidar system 100 at the respective times when the first and second jamming pulses were detected, and by using the first and second source directions of the jamming pulses from those locations. More specifically, the location of the hostile source can be determined to be at the intersection of a line from the first location, extending in the first source direction, with a line from the second location, extending in the second source direction. Once an estimate of the location of the hostile source has been determined, lidar system 100 can output a notification informing other devices and/or appropriate authorities of the presence of a possible hostile source at the identified time and location.

FIG. 12B illustrates a second example method 1200b by which lidar system 100 can determine the location of a hostile source based on detection of a jamming pulse. The method 1200b begins at block 1210b where lidar system 100 detects a jamming pulse. Then, at block 1220b, lidar system 100 determines the source direction of the jamming pulse. Once again, the source direction of the jamming pulse can be determined based on the state of scanner 120 when the jamming pulse was received.

The method 1200b continues at block 1230b where lidar system 100 determines the distances corresponding to detected pulses in the angular region in proximity to, or surrounding, the source direction of the jamming pulse. For example, lidar system 100 may analyze valid return pulses which were detected within a selected range of angles around the source direction of the detected jamming pulse. Lidar system 100 may determine the distance measurements associated with those valid return pulses and may then determine the distance to the hostile source which emitted the jamming pulse based on those distance measurements (e.g., by averaging the distance measurements associated with the selected valid return pulses). For example, if one or more valid return pulses in proximity to, or surrounding, the angular location of the detected jamming pulse are all associated with distance measurements that are within a selected range of one another, then there is a likelihood that the jamming pulse was emitted from about the same distance. Accordingly, lidar system 100 can determine the location of the hostile source based on the source direction from which the jamming pulse was detected and the distance determined based on surrounding valid return pulses.

In some embodiments, lidar system 100 may also perform image processing algorithms, such as object detection and/or recognition, on the point cloud image produced from the valid return pulses surrounding the source direction of the detected jamming pulse. Using such algorithms, lidar system 100 may be able to identify a particular person or object as the likely source of the jamming pulse. Once again, after an estimate of the location of the hostile source has been determined, lidar system 100 can output a notification informing other devices and/or appropriate authorities of the presence of a possible hostile source at the identified time and location.

Figure 13:
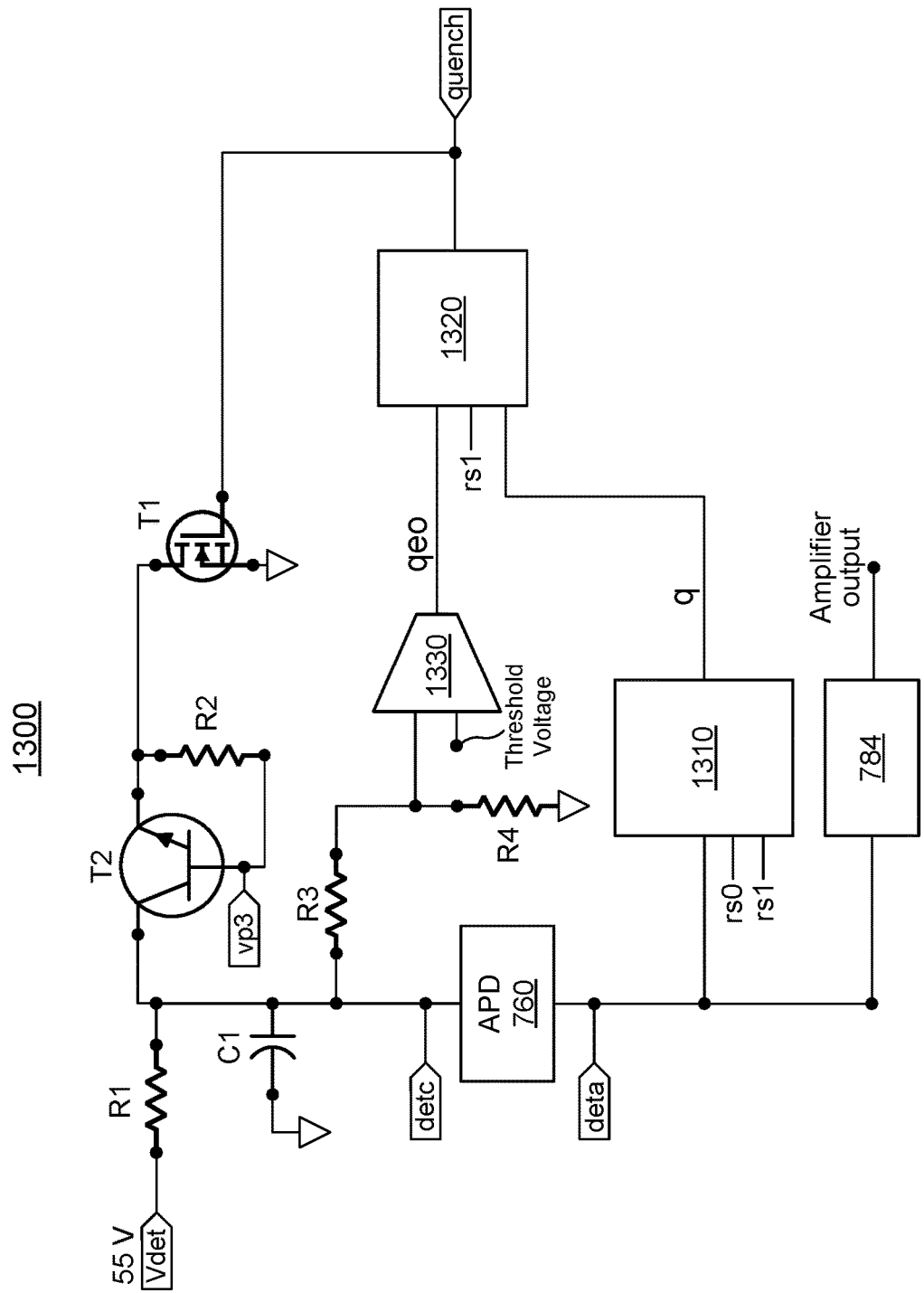
FIG. 13 is a schematic of an example quench circuit for protecting an APD from damage due to jamming pulses.

FIG. 13 is a schematic of an example quench circuit 1300 for protecting APD 760 from damage due to jamming pulses. In the illustrated schematic, APD 760 has two connection nodes: the detector cathode, detc, and the detector anode, deta. A voltage, Vdet, is connected to the detector cathode, detc, via a resistor, R1, to reverse bias APD 760. In the illustrated embodiment, this voltage, Vdet, is 55 V. In some embodiments, Vdet is selected to be below the breakdown threshold of APD 760, such that the detector is operated in linear mode. In other embodiments, Vdet may be set above the breakdown voltage to operate the APD in Geiger mode. When detector 760 is not being quenched, little or no current flows at the detector cathode, detc, so there is little or no voltage drop across R1. Accordingly, Vdet is applied at the detector cathode, detc, thereby reverse biasing APD 760.

While in normal operating mode, APD 760 produces an output current based on the number of photons which are incident upon it. This current flows from the detector anode, deta, to a preamplifier 784. The preamplifier 784 may be designed with a suitable gain to operate on the smaller signals which result from valid return pulses, rather than the larger signals which may result from anomalous pulses. The output from preamplifier 784 can be connected to other circuitry for detecting a valid return pulse and determining an associated time of flight (e.g., comparator 786-1, TDC 788, etc.)

When a detected pulse exceeds the jamming threshold, the current generated in APD 760 can become large enough to cause irreversible damage in the detector. Quench circuit 1300 acts to reduce the reverse bias voltage at the detector cathode, detc, when a detected pulse exceeds the jamming threshold. By reducing the reverse bias voltage, the avalanche gain of the detector can be reduced to a safe level. In some embodiments, quench circuit 1300 is capable of quenching APD 760 within 10 ns or less, 5 ns or less, or 1 ns or less of the jamming pulse having been sensed to have first exceeded the jamming threshold.

Quench circuit 1300 detects when a detected pulse exceeds the jamming threshold using circuit element 1310, which is connected to the detector anode, deta. Circuit element 1310 may, but need not, include an amplifier. Typically, the gain of the amplifier in circuit element 1310 is significantly less than the gain of preamplifier 784 so as to be suited to the larger signals resulting from anomalous pulses. Circuit element 1310 can also include a comparator (e.g., comparator 786-3 in FIG. 11A, or some other comparator) to determine when the detected pulse exceeds the jamming threshold. In some embodiments, there may be a resistor or resistor network and other circuitry between deta and the input of circuit element 1310 that creates a voltage level that can be compared against the jamming threshold. In addition, circuit element 1310 can latch the output of the comparator when the jamming threshold is exceeded. Accordingly, circuit element 1310 produces a digital signal, q, when a jamming pulse is detected. The output signal, q, from circuit element 1310 triggers the quench. Later, once the quench is complete, the output, q, of circuit element 1310 can be reset using one or more reset input signals (i.e., rs0 and rs1).

The output, q, of circuit element 1310 is connected to circuit element 1320. Circuit element 1320 can perform one or more operations to drive its output signal, quench, active when the output, q, of circuit element 1310 is active, or to drive the quench signal inactive in response to one or more reset signals. These reset signals can include, for example, the input, rs1, of circuit element 1320, which can be used to cause a quench reset before lidar system 100 outputs a pulse from light source 110. This ensures that the quench signal is driven inactive, and APD 760 is therefore not being quenched, before lidar system 100 emits a pulse to perform a distance measurement. Circuit element 1320 can also include another reset signal, qeo. This reset signal, qeo, is generated by comparator 1330, which monitors the reverse bias voltage being applied to the cathode, detc, of APD 760, as discussed further below.

The output, quench, of circuit element 1320 is connected to the gate of transistor T1, which can be a MOSFET device with relatively high transconductance. The relatively high transconductance allows transistor T1 to rapidly output a relatively large amount of current. The drain of T1 is connected to the emitter of transistor T2, which is itself connected to the base of transistor T2 via a resistor, R2. A voltage, vp3, is also connected to the base of T2. The collector of transistor T2 is connected to Vdet via R1. Transistor T2 can be, for example, a high power or high voltage BJT device capable of handling high voltages up to, for example, about 100 V.

When the output, quench, of circuit element 1320 is active, it in turn activates transistor T1. This allows current to flow, via R2, from the base of transistor T2 to ground through transistor T1. The resulting voltage drop across R2 activates transistor T2 which allows current to flow through R1 from Vdet. The resulting voltage drop across R1 reduces the reverse bias voltage applied to the detector cathode, detc. In some embodiments, the reverse bias voltage at the detector cathode is reduced to about 25 V or less. By lowering the reverse bias voltage at the detector cathode, detc, the avalanche gain—the number of additional charge carriers generated by each photo-induced charge carrier at APD 760—is reduced, thereby quenching the detector and avoiding damage. For example, the reverse bias voltage applied to a linear-mode APD may be between approximately 20 V and 100 V, and the corresponding gain of a linear-mode APD may be between approximately 10 and 100. As another example, a linear-mode APD may operate with a reverse bias voltage of 50 V and a gain of 30. When the APD is quenched, the reverse bias voltage may be reduced to less than 20 V, and the gain may drop to 1. The output, quench, of circuit element 1320 may also be sent to anomalous pulse logic 790 to indicate that a jamming signal has been received.

A capacitor C1 is connected from ground to the detector cathode, detc. This capacitor serves the purpose of reducing high frequency noise which is caused by resistor R1. While, resistor R1 serves the useful function of dropping the reverse bias voltage applied at the detector cathode, detc, it also can create noise at high frequencies, which can be detrimental to operation of the quench circuit 1300. Capacitor C1 solves this problem by filtering out the high frequency noise.

There is also a voltage divider network, made up of resistors R3 and R4, which is connected to the detector cathode, detc. This voltage divider network senses the reverse bias voltage being applied to APD 760, reduces that voltage, and feeds the reduced voltage into comparator 1330. Comparator 1330 outputs a reset signal, qeo, to circuit element 1320 once the reverse bias voltage applied to the detector cathode, detc, has dropped below a selected threshold. The threshold voltage of comparator 1330 can be set to a value at which the avalanche gain of APD 760 is sufficiently low to avoid damage to the detector. Once the reset signal, qeo, is enabled, it resets circuit element 1320, which in turn drives its output, quench, to the deactivated state. This terminates the quenching of APD 760. Thus, comparator 1330 provides feedback to cease quenching APD 760 based on the applied reverse bias voltage.

The advantage of using the voltage divider network, R3 and R4, to feed the reverse bias voltage from the detector cathode, detc, into comparator 1330 is that the voltage divider resistors R3 and R4 can handle relatively high power and high voltages despite being fabricated as part the integrated circuit using the same low power or low voltage CMOS process which is used to fabricate the other elements of the integrated circuit. These resistors take the relatively high voltage signal at the detector cathode, detc, and divide it down to present a reduced voltage at comparator 1330, thereby allowing the comparator to be fabricated using the low power or low voltage CMOS fabrication process, rather than requiring high power or high voltage devices which might otherwise be needed to handle the relatively high reverse bias voltage present at the detector cathode, detc.

In some embodiments, all of the circuitry illustrated in FIG. 13 except for transistor T2 and APD 760 is provided on a chip as an integrated circuit which is made using, for example, a low power CMOS fabrication technology (which may be referred to as low-voltage CMOS or low-voltage integrated circuits). Active electronic devices made using this low power CMOS technology may be unsuitable for exposure to the voltage needed to reverse bias APD 760. For example, an operating voltage of a low power CMOS circuit may be between approximately 0.5 V and 5 V, while the reverse-bias voltage of an APD may be greater than 20 V. Transistor T2, which is exposed to that high voltage, can therefore be a discrete higher power or higher voltage device, separate from the rest of the integrated circuit, and can be provided off-chip. Due to the relatively high power dissipation capabilities needed by transistor T2 in order to achieve quench times under 10 ns, and the high voltages that transistor T2 is required to handle, if transistor T2 were fabricated on-chip, a higher power or higher voltage CMOS fabrication technology may be required for the integrated circuit. This would in turn increase cost for the entire integrated circuit. By providing transistor T2 off-chip, however, the quench circuit 1300 can enjoy the advantages of a low power or low voltage integrated circuit process while also being capable of discharging a large amount of current via transistor T2 and handling larger voltages, which enables a very fast quench of APD 760. In some embodiments, the off-chip transistor T2 is connected to the integrated circuit via wire bonding or bump bonding. Bump bonding, in particular, may allow for a low capacitance, low inductance interconnect which may in turn allow transistor T2 to draw current more quickly, thereby achieving a faster quench.

Figure 14:
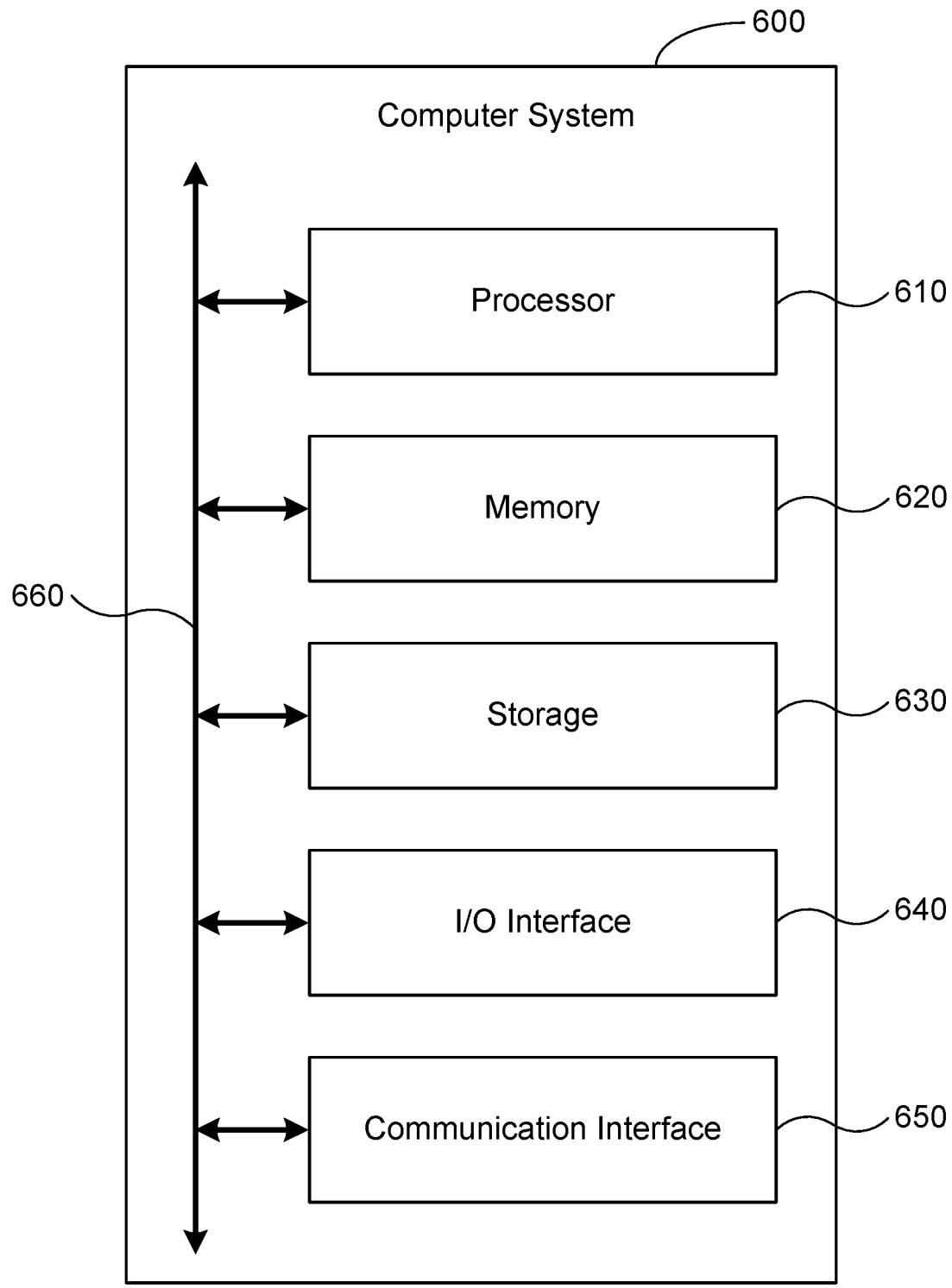
FIG. 14 illustrates an example computer system.

FIG. 14 illustrates an example computer system 600. In particular embodiments, one or more computer systems 600 may perform one or more steps of one or more methods described or illustrated herein. In particular embodiments, one or more computer systems 600 may provide functionality described or illustrated herein. In particular embodiments, software running on one or more computer systems 600 may perform one or more steps of one or more methods described or illustrated herein or may provide functionality described or illustrated herein. Particular embodiments may include one or more portions of one or more computer systems 600. In particular embodiments, a computer system may be referred to as a computing device, a computing system, a computer, a general-purpose computer, or a data-processing apparatus. Herein, reference to a computer system may encompass one or more computer systems, where appropriate.

Computer system 600 may take any suitable physical form. As an example, computer system 600 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 600 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 600 may include one or more computer systems 600; be unitary or distributed; span multiple locations; span multiple machines; span multiple data centers; or reside in a cloud, which may include one or more cloud components in one or more networks. Where appropriate, one or more computer systems 600 may perform without substantial spatial or temporal limitation one or more steps of one or more methods described or illustrated herein. As an example, one or more computer systems 600 may perform in real time or in batch mode one or more steps of one or more methods described or illustrated herein. One or more computer systems 600 may perform at different times or at different locations one or more steps of one or more methods described or illustrated herein, where appropriate.

As illustrated in the example of FIG. 14, computer system 600 may include a processor 610, memory 620, storage 630, an input/output (I/O) interface 640, a communication interface 650, or a bus 660. Computer system 600 may include any suitable number of any suitable components in any suitable arrangement.

In particular embodiments, processor 610 may include hardware for executing instructions, such as those making up a computer program. As an example, to execute instructions, processor 610 may retrieve (or fetch) the instructions from an internal register, an internal cache, memory 620, or storage 630; decode and execute them; and then write one or more results to an internal register, an internal cache, memory 620, or storage 630. In particular embodiments, processor 610 may include one or more internal caches for data, instructions, or addresses. Processor 610 may include any suitable number of any suitable internal caches, where appropriate. As an example, processor 610 may include one or more instruction caches, one or more data caches, or one or more translation lookaside buffers (TLBs). Instructions in the instruction caches may be copies of instructions in memory 620 or storage 630, and the instruction caches may speed up retrieval of those instructions by processor 610. Data in the data caches may be copies of data in memory 620 or storage 630 for instructions executing at processor 610 to operate on; the results of previous instructions executed at processor 610 for access by subsequent instructions executing at processor 610 or for writing to memory 620 or storage 630; or other suitable data. The data caches may speed up read or write operations by processor 610. The TLBs may speed up virtual-address translation for processor 610. In particular embodiments, processor 610 may include one or more internal registers for data, instructions, or addresses. Processor 610 may include any suitable number of any suitable internal registers, where appropriate. Where appropriate, processor 610 may include one or more arithmetic logic units (ALUs); may be a multi-core processor; or may include one or more processors 610.

In particular embodiments, memory 620 may include main memory for storing instructions for processor 610 to execute or data for processor 610 to operate on. As an example, computer system 600 may load instructions from storage 630 or another source (such as, for example, another computer system 600) to memory 620. Processor 610 may then load the instructions from memory 620 to an internal register or internal cache. To execute the instructions, processor 610 may retrieve the instructions from the internal register or internal cache and decode them. During or after execution of the instructions, processor 610 may write one or more results (which may be intermediate or final results) to the internal register or internal cache. Processor 610 may then write one or more of those results to memory 620. One or more memory buses (which may each include an address bus and a data bus) may couple processor 610 to memory 620. Bus 660 may include one or more memory buses. In particular embodiments, one or more memory management units (MMUs) may reside between processor 610 and memory 620 and facilitate accesses to memory 620 requested by processor 610. In particular embodiments, memory 620 may include random access memory (RAM). This RAM may be volatile memory, where appropriate. Where appropriate, this RAM may be dynamic RAM (DRAM) or static RAM (SRAM). Memory 620 may include one or more memories 620, where appropriate.

In particular embodiments, storage 630 may include mass storage for data or instructions. As an example, storage 630 may include a hard disk drive (HDD), a floppy disk drive, flash memory, an optical disc, a magneto-optical disc, magnetic tape, or a Universal Serial Bus (USB) drive or a combination of two or more of these. Storage 630 may include removable or non-removable (or fixed) media, where appropriate. Storage 630 may be internal or external to computer system 600, where appropriate. In particular embodiments, storage 630 may be non-volatile, solid-state memory. In particular embodiments, storage 630 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 630 may include one or more storage control units facilitating communication between processor 610 and storage 630, where appropriate. Where appropriate, storage 630 may include one or more storages 630.

In particular embodiments, I/O interface 640 may include hardware, software, or both, providing one or more interfaces for communication between computer system 600 and one or more I/O devices. Computer system 600 may include one or more of these I/O devices, where appropriate. One or more of these I/O devices may enable communication between a person and computer system 600. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 640 may include one or more device or software drivers enabling processor 610 to drive one or more of these I/O devices. I/O interface 640 may include one or more I/O interfaces 640, where appropriate.

In particular embodiments, communication interface 650 may include hardware, software, or both providing one or more interfaces for communication (such as, for example, packet-based communication) between computer system 600 and one or more other computer systems 600 or one or more networks. As an example, communication interface 650 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 600 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 600 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 600 may communicate using fiber-optic communication based on 100 Gigabit Ethernet (100 GbE), 10 Gigabit Ethernet (10 GbE), or Synchronous Optical Networking (SONET). Computer system 600 may include any suitable communication interface 650 for any of these networks, where appropriate. Communication interface 650 may include one or more communication interfaces 650, where appropriate.

In particular embodiments, bus 660 may include hardware, software, or both coupling components of computer system 600 to each other. As an example, bus 660 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 660 may include one or more buses 660, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 600. As an example, computer software may include instructions configured to be executed by processor 610. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A circuit for quenching an avalanche photodiode (APD) detector, the circuit comprising:
    a discrete transistor configured to draw a quench current so as to enable a drop in a reverse bias voltage applied to the APD detector; and
    an integrated circuit connected to the discrete transistor, the integrated circuit including a plurality of circuit elements for controlling the reverse bias voltage.

2. The circuit of claim 1, wherein the integrated circuit further comprises a plurality of comparators, wherein the output of each comparator is connected to an input channel of a time-to-digital converter.

3. The circuit of claim 1, wherein the discrete transistor is connected to the integrated circuit via wire bonding.

4. The circuit of claim 1, wherein the discrete transistor is connected to the integrated circuit via bump bonding.

5. The circuit of claim 1, wherein the integrated circuit includes a first comparator configured to determine when a detected optical pulse has exceeded a jamming threshold.

6. The circuit of claim 5, wherein the jamming threshold is set to avoid damage to the APD detector.

7. The circuit of claim 5, wherein the circuit is configured to quench the APD detector when the jamming threshold is exceeded.

8. The circuit of claim 7, wherein the circuit is configured to quench the APD detector within 10 ns.

9. The circuit of claim 8, wherein the circuit is configured to quench the APD detector within 1 ns.

10. The circuit of claim 5, wherein an output of the first comparator is latched in an active state when the detected optical pulse has exceeded the jamming threshold.

11. The circuit of claim 5, wherein the first comparator causes the discrete transistor to draw the quench current when the detected optical pulse has exceeded the jamming threshold.

12. The circuit of claim 1, wherein the discrete transistor is connected to a reverse bias voltage source via a resistor.

13. The circuit of claim 12, wherein the drop in the reverse bias voltage is across the resistor.

14. The circuit of claim 13, wherein a capacitor is connected to the resistor to reduce noise created by the resistor.

15. The circuit of claim 1, wherein the integrated circuit includes a resistor network and a second comparator, the resistor network being configured to sense the reverse bias voltage applied to the APD detector and to provide a reduced version of the reverse bias voltage to the second comparator.

16. The circuit of claim 15, wherein the second comparator causes the discrete transistor to cease drawing the quench current when the reverse bias voltage drops below a threshold value.

\* \* \* \* \*